(12) United States Patent
Velazquez

(10) Patent No.: US 8,164,496 B2
(45) Date of Patent: *Apr. 24, 2012

(54) MISMATCH COMPENSATORS AND METHODS FOR MISMATCH COMPENSATION

(76) Inventor: Scott R. Velazquez, San Diego, CA (US)

( * ) Notice: Subject to any disclaimer, the term of this patent is extended or adjusted under 35 U.S.C. 154(b) by 43 days.

This patent is subject to a terminal disclaimer.

(21) Appl. No.: 12/908,783

(22) Filed: Oct. 20, 2010

(65) Prior Publication Data

US 2011/0260898 A1     Oct. 27, 2011

Related U.S. Application Data

(63) Continuation of application No. 12/817,075, filed on Jun. 16, 2010, now Pat. No. 7,940,198, which is a continuation-in-part of application No. 12/112,380, filed on Apr. 30, 2008, now Pat. No. 7,782,235.

(60) Provisional application No. 60/915,110, filed on Apr. 30, 2007.

(51) Int. Cl.
*H03M 1/06* (2006.01)

(52) U.S. Cl. ........ 341/118; 455/295; 455/303; 324/603; 375/346; 375/226

(58) Field of Classification Search .......... 341/118–159; 375/226; 455/295, 303
See application file for complete search history.

(56) References Cited

U.S. PATENT DOCUMENTS

| | | | | |
|---|---|---|---|---|
| 6,388,594 B1 * | 5/2002 | Velazquez et al. | ............ | 341/120 |
| 6,473,013 B1 * | 10/2002 | Velazquez et al. | ............ | 341/120 |
| 6,900,750 B1 * | 5/2005 | Nairn | ............. | 341/118 |
| 6,977,977 B1 * | 12/2005 | Dubrovin et al. | ............ | 375/346 |
| 7,033,753 B1 * | 4/2006 | Kool | ............. | 435/6.12 |
| 7,049,984 B2 * | 5/2006 | Wood et al. | ............. | 341/120 |
| 7,227,479 B1 * | 6/2007 | Chen et al. | ............. | 341/118 |
| 7,233,270 B2 * | 6/2007 | Lin | ............. | 341/118 |
| 7,330,140 B2 * | 2/2008 | Balakrishnan et al. | ........ | 341/118 |
| 7,382,297 B1 * | 6/2008 | Kopikare et al. | ............ | 341/118 |
| 7,482,817 B2 * | 1/2009 | Miyamoto | ............. | 324/603 |
| 7,782,235 B1 * | 8/2010 | Velazquez | ............. | 341/118 |
| 7,940,198 B1 * | 5/2011 | Velazquez | ............. | 341/118 |

* cited by examiner

*Primary Examiner* — Lam T Mai
(74) *Attorney, Agent, or Firm* — San Diego IP Law Group LLP

(57) ABSTRACT

In a compensator for compensating mismatches, and in methods for such compensation, the compensator compensates for mismatches in output signals of a system with mismatches during normal operation of the system with mismatches. The compensator comprises: a mismatch estimator that monitors at least two mismatched signals output by the system with mismatches during normal operation and that generates matching parameters indicating an amount of mismatch between the at least two mismatched signals, the mismatch estimator updating the matching parameters during normal operation of the system with mismatches, and a mismatch equalizer that compensates mismatches in the mismatched signals output by the system with mismatches during normal operation of the system with mismatches in response to the matching parameters.

41 Claims, 12 Drawing Sheets

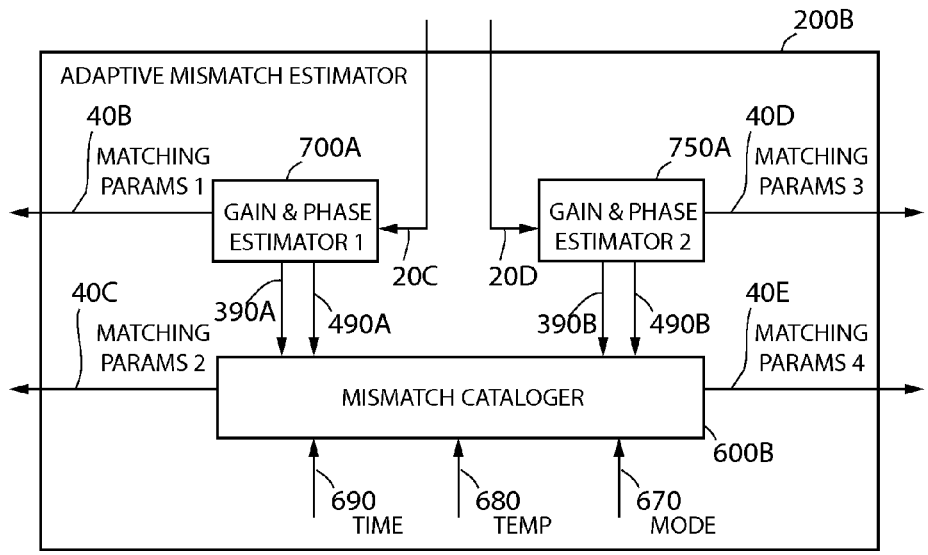
Fig. 14
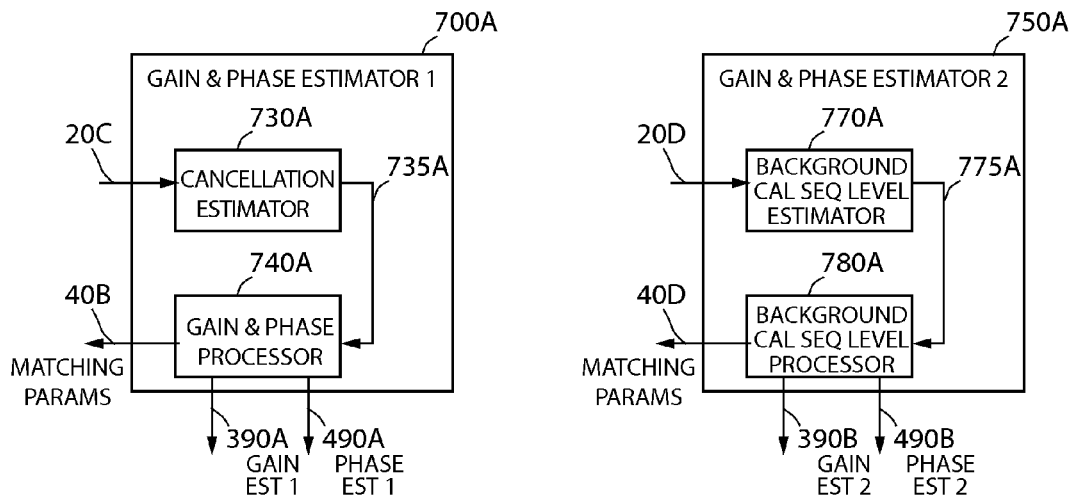
Fig. 15
Fig. 16

| MEASUREMENT NUMBER | GAIN MISMATCH | PHASE MISMATCH | DC OFFSET MISMATCH | TIME | TEMPERATURE | MODE |
|---|---|---|---|---|---|---|
| | | | | | | |
| | | | | | | |
| | | | | | | |
| | | | | | | |

MISMATCH COMPENSATORS AND METHODS FOR MISMATCH COMPENSATION

RELATED APPLICATIONS

This application is a continuation of U.S. patent application Ser. No. 12/817,075, filed on Jun. 16, 2010, now U.S. Pat. No. 7,940,198 entitled "Amplifier Linearizer" which is a continuation-in-part of U.S. patent application Ser. No. 12/112,380, filed on Apr. 30, 2008, now U.S. Pat. No. 7,782,235 entitled "Adaptive Mismatch Compensators and Methods for Mismatch Compensation," which claims priority under 35 U.S.C. §119(e) to U.S. Provisional Patent Application Ser. No. 60/915,110 filed on Apr. 30, 2007, entitled "Adaptive Mismatch Equalizer," the entire disclosures of which are all hereby incorporated by reference.

FIELD OF THE INVENTION

Embodiments of the present invention relate generally to a method and apparatus for adaptively compensating for signal mismatches, and, more particularly, to an adaptive background method and apparatus for estimating gain, phase, and DC-offset mismatches and a method and apparatus for compensating for such mismatches.

BACKGROUND

Signal mismatches in electronic devices, including gain, phase, and DC-offset mismatches, are caused by many different factors, and are generated primarily in the analog electronics of a system, such as amplifiers, analog-to-digital converters, digital-to-analog converters, or delay elements. These devices tend to introduce mismatches that have undesirable effects, such as distortion, that limit the performance of systems. Mismatches can severely limit the cancellation of signals, which is critical in many applications such as beamforming, nonlinear distortion compensation, and analog-to-digital conversion.

One particularly demanding application is a high-speed, high-resolution analog-to-digital converter (ADC) that uses an array of ADCs to increase the speed and resolution of the conversion operation. Signal mismatches between converters, such as gain mismatch, phase mismatch, or DC-offset, often prohibit existing parallel architectures, such as Time-Interleaving-based architectures, from achieving high resolution. Even a small drift in the signal mismatches can significantly limit system performance. Signal mismatches can be caused by a number of different factors, including imprecise analog component values, line-length mismatches, and other variations in the analog front-end electronics. To achieve high resolution (e.g., greater than 12 bits), conventional parallel approaches, such as Time-Interleaving, require analog phase matching performance on the order of femto-seconds and gain matching better than 0.1%, which are extremely challenging constraints to achieve.

Conventional mismatch compensation techniques often require the injection of calibration tones or switching the unit into an off-line mode for calibration. Conventional architectures often do not track mismatches that change over time or other environmental conditions, such as airflow causing a temperature gradient. For these reasons, the performance, including speed or resolution, for example, of such architectures, is therefore limited.

FIG. 1 is a block diagram of a conventional matching system with offline calibration. A conventional approach to calibrating a system with mismatches 50 includes a gain and phase adjustment unit 27 and an offline calibrator 28. During normal operation of the system with mismatches 50, the system with mismatches 50 receives input signals 10, and the gain and phase of the unmatched signals 20 are adjusted by the gain and phase adjustment unit 27 to help minimize the mismatches in the output signals 31.

During calibration, however, the normal operation of the system is interrupted by calibration switches 29 that change the inputs to the system with mismatches with mismatches 50 to calibration signals 15. In a calibration mode, the calibration signals are applied to the system with mismatches 50, and the resulting calibration monitor signals 16 are analyzed by the offline calibrator 28. The offline calibrator 28, in turn, estimates the gain and phase mismatches of the calibration monitor signals 16, and applies gain and phase mismatch parameters 41 to the gain and phase adjustment unit 27 to compensate for mismatches in the applied mismatched signals 20.

Another limitation of the conventional approaches is that the offline calibrator 28 does not characterize the variation of the mismatches with respect to the frequency of the input signals 10. Instead, the offline calibrator 28 provides fixed gain and phase mismatch parameters 41 to the gain and phase adjustment unit 27 in response to calibration signals 15. Further, the gain and phase adjustment unit 27 compensates input signals with varying frequencies with a constant gain and phase shift. Thus the conventional matching system does not accurately compensate for varying mismatches when input signals 10 have varying frequency.

A conventional approach to system monitoring uses a monitoring signal that includes tones with frequencies that are not intended to overlap those frequencies in use by the system. While this approach does not interrupt the normal operation of the system, it does, however, require advanced knowledge of the frequency content of the signals being processed by the system and limits the usable frequency range of the system. In addition, system performance is only characterized at the few frequencies used by the monitoring tone or tones. The monitoring tones may also interfere with the normal, accurate functioning of the system, since the tones may have frequency content that is near frequencies in use by the system.

Another limitation of conventional calibration methods is that they generally do not consider measurement history for updating the compensation processing, but rather they simply employ a most recent measurement to update the compensation. This approach fails to provide stable system performance because a one-time glitch or inaccurate measurement can cause a miscalibration that significantly degrades system performance until such a time that a more accurate measurement can be made. Also, for applications such as frequency-hopping where frequency changes are very rapid, this type of calibration cannot update itself quickly enough to track mismatches that are different with respect to input frequency. By the time the mismatches have been measured and corrected for a particular frequency, the frequency of the input signal may have already changed.

SUMMARY OF THE INVENTION

Embodiments of the present invention overcome drawbacks of the conventional approaches by adaptively compensating for mismatches in a system with mismatches in the background, during normal operation, without interrupting the normal operation of the system. Embodiments of the present invention do not require that the system with mismatches be taken offline while the inputs are switched to calibration signals to characterize the performance. Furthermore, unlike conventional approaches, embodiments of the present invention are capable of measuring mismatches that vary with input signal frequency and adaptively compensate for varying mismatches.

Embodiments of the present invention can include a gain or phase mismatch estimator with a frequency channelizer to partition the input signal into a plurality of subbands and to calculate the mismatches independently on each subband. In addition, embodiments of the present invention utilize signal processing that compensates for mismatches of a type that vary with respect to frequency. Embodiments of the present invention can also compensate for mismatches that vary with time, temperature, mode of operation, air flow, signal amplitude, waveform type, and other dynamic parameters.

Background adaptive mismatch estimation and compensation techniques, in accordance with embodiments of the present invention, can be included to provide ongoing monitoring and optimization of the estimation and compensation processing over widely varying physical and signal environments (such as temperature, air flow, input frequency, sample rate, Nyquist zone). Even a small amount of drift in the analog mismatches can limit the performance of the system, and a background adaptive mismatch estimation and compensation technique in accordance with embodiments of the present invention detects and corrects these drifts automatically in the background without requiring the injection of calibration tones or switching the unit off-line for calibration. The incoming signal can be employed to measure the performance and continuously compensate itself. Background adaptive mismatch estimation and compensation techniques can simplify or eliminate the need for factory calibration.

One conventional mismatch estimation approach uses a calibration signal that includes calibration tones that can interfere with the normal, accurate functioning of the system. Embodiments of the present invention can overcome this limitation by adding a background calibration sequence signal to the input signal where the background calibration sequence signal is statistically unrelated to the input signal of the system and can even have frequency content that directly overlaps frequencies in use by the system. In one embodiment, the magnitude of the background calibration sequence signal can be evaluated and the phase shift of mismatched signals successively adjusted until the detected magnitude is maximized, indicating that the actual phase mismatch has been calculated. The gain mismatch is equal to the maximized magnitude of the background calibration sequence. The background calibration sequence signal can then be subtracted from the system output so that it does not interfere with any desired signals being processed by the system. This approach overcomes the limitations of conventional approaches because it can characterize mismatches for any frequency, and it does not interfere with the normal functioning of the system.

One architecture for analog-to-digital conversion in accordance with embodiments of the present invention can use a parallel array of analog-to-digital converters to improve the speed of the conversion. Accurate conversion occurs when the outputs of each of the analog-to-digital converters in the array are matched. Mismatches can be estimated in the background with a successive phase difference procedure. Background adaptive mismatch estimation and compensation techniques in accordance with the present invention may be used to compensate for mismatches between the outputs of the analog-to-digital converters in the array.

Another architecture for analog-to-digital conversion in accordance with embodiments of the present invention can use a plurality of analog-to-digital converters, wherein larger amplitude signals are successively cancelled at each stage of conversion, allowing a more accurate conversion than a single converter provides. Accurate cancellation occurs when the signal paths through the stages of conversion are matched. Mismatches at each stage can be estimated in the background with a successive vector cancellation method or a background calibration sequence method. Background adaptive mismatch estimation and compensation techniques in accordance with the present invention may be used to compensate for mismatches between the stages.

A limitation of conventional calibration methods is that they generally do not use a history of measurements to update the compensation processing, but instead simply use the most recent measurements to update the processing. A heuristic compensation system and method in accordance with embodiments of the present invention can overcome this limitation by cataloging the current set of measurements and intelligently combining or discarding recent measurements, thereby providing stable performance.

In one aspect a mismatch compensator compensates for mismatches in output signals of a system with mismatches during normal operation of the system with mismatches. The compensator comprises: a mismatch estimator that monitors at least two mismatched signals output by the system with mismatches during normal operation and that generates matching parameters indicating an amount of mismatch between the at least two mismatched signals, the mismatch estimator updating the matching parameters during normal operation of the system with mismatches and a mismatch equalizer that compensates mismatches in the mismatched signals output by the system with mismatches during normal operation of the system with mismatches in response to the matching parameters.

In one embodiment the mismatch estimator continually monitors the at least two mismatched signals output by the system with mismatches and continually updates the matching parameters during normal operation of the system with mismatches, and wherein the mismatch equalizer adaptively compensates mismatches in the mismatched signals output by the system with mismatches during normal operation of the system with mismatches.

In another embodiment the matching parameters comprise at least one of: a DC-offset parameter, a gain parameter, and a phase shift parameter.

In another embodiment the mismatch equalizer compensates for mismatches in at least two mismatched signals as a function of frequency.

In another embodiment the mismatch equalizer comprises a coefficient generator that receives the matching parameters and generates filter coefficients and a plurality of digital signal processors that compensate for gain and phase mismatches in response to the filter coefficients.

In another embodiment the mismatch estimator comprises: at least one of a gain estimator that calculates gain estimates of the at least two mismatched signals output by the system with mismatches, a phase estimator that calculates phase estimates of the at least two mismatched signals output by the system with mismatches, a DC-offset estimator that calculates DC-offset estimates of the at least two mismatched signals output by the system with mismatches and wherein the mismatch estimator generates the matching parameters in response to at least one of the gain estimates, the phase estimates and the DC-offset estimates.

In another embodiment the mismatch estimator further comprises a cataloger that stores histories of at least one of the gain estimates, the phase estimates and the DC-offset estimates, and that heuristically processes the stored estimates to generate the matching parameters.

In another embodiment the cataloger further stores histories of at least one of time, temperature and mode of operation information of the system with mismatches and heuristically processes the stored estimates and information to generate the matching parameters.

In another embodiment the mismatch estimator further comprises: a channelizer that partitions each of the at least two mismatched signals output by the system with mismatches into channelized signals in response to a channel select signal wherein the channelized signals represent a selected frequency subband of the unmatched output signals of the system with mismatches, wherein the gain estimator calculates gain estimates of the channelized signals, wherein the phase estimator calculates phase estimates of the channelized signals, and wherein the DC-offset estimator calculates DC-offset estimates of the channelized signals.

In another embodiment the phase estimator comprises: a plurality of variable phase shifters that adjust phases of the channelized signals in response to variable phase shift signals and generates phase shifted signals, a plurality of subtractors that subtract the phase shifted signals of respective variable phase shifters to generate difference signals, a plurality of level estimators that calculate the magnitudes of the difference signals and that generate phase difference signals, and a phase processor that processes the phase difference signals and generates phase estimate signals.

In another embodiment the phase processor processes the phase difference signals and generates the variable phase shift signals using an iterative optimization and generates the phase estimate signals.

In another embodiment the level estimators generate phase difference signals by a running average of the squared amplitude of each of the difference signals.

In another embodiment the mismatch estimator comprises a gain and phase estimator that calculates gain estimates and phase estimates of the channelized signals.

In another embodiment the gain and phase estimator comprises: a plurality of variable gain and phase shifters that adjust gains and phases of the channelized signals in response to variable gain and phase shift signals and generates gain and phase shifted signals, a plurality of subtractors that subtract the gain and phase shifted signals of respective variable gain and phase shifters to generate difference signals, a plurality of cancellation estimators that calculate the magnitude of the vector cancellation of the difference signals and that generate vector cancellation level signals, and a gain and phase processor that processes the vector cancellation level signals and generates gain and phase estimate signals.

In another embodiment the gain and phase processor processes the vector cancellation level signals and generates variable gain and phase shift signals using an iterative optimization and generates the gain and phase estimate signals.

In another embodiment the gain and phase estimator comprises: a plurality of variable phase shifters that adjust a phase of the channelized signals in response to variable phase shift signals and generates phase shifted signals, a plurality of background calibration sequence level estimators that calculate the magnitude of the background calibration sequence signal to generate calibration sequence level signals, and a background calibration sequence processor that processes the calibration level sequence signals and generates gain and phase estimate signals.

In another embodiment the background calibration sequence processor processes the calibration level sequence signals and generates variable phase shift signals using an iterative optimization and generates gain and phase estimate signals.

In another aspect an analog-to-digital converter system compensates for mismatches in converted digital signals during normal operation of the analog-to-digital converter system. The analog-to-digital converter system comprises: a plurality of analog-to-digital converters, each converting an analog input signal to a converted digital signal, the converted digital signals having mismatches, a mismatch estimator that monitors at least two mismatched converted digital signals output by the analog-to-digital converters during normal operation and that generates matching parameters indicating an amount of mismatch between the at least two mismatched converted digital signals, the mismatch estimator updating the matching parameters during normal operation of the analog-to-digital converter system, and a mismatch equalizer that compensates mismatches in the mismatched converted digital signals output by the analog-to-digital converters during normal operation of the analog-to-digital converter system in response to the matching parameters.

In one embodiment the mismatch estimator continually monitors the at least two mismatched converted digital signals output by the analog-to-digital converters and continually updates the matching parameters during normal operation of the analog-to-digital converter system, and wherein the mismatch equalizer adaptively compensates mismatches in the mismatched signals output by the analog-to-digital converters during normal operation of the analog-to-digital converter system.

In another embodiment the matching parameters comprise at least one of: a DC-offset parameter, a gain parameter, and a phase shift parameter.

In another embodiment the mismatch equalizer compensates for mismatches in at least two mismatched signals as a function of frequency.

In another embodiment the mismatch equalizer comprises: a coefficient generator that receives the matching parameters and generates filter coefficients, and a plurality of digital signal processors that compensate for gain and phase mismatches in response to the filter coefficients.

In another embodiment the mismatch estimator comprises at least one of: a gain estimator that calculates gain estimates of the at least two mismatched signals output by the analog-to-digital converters, a phase estimator that calculates phase estimates of the at least two mismatched signals output by the analog-to-digital converters, a DC-offset estimator that calculates DC-offset estimates of the at least two mismatched signals output by the analog-to-digital converters, and wherein the mismatch estimator generates the matching parameters in response to at least one of the gain estimates, the phase estimates and the DC-offset estimates.

In another embodiment the mismatch estimator further comprises a cataloger that stores histories of at least one of the gain estimates, the phase estimates and the DC-offset estimates, and that heuristically processes the stored estimates to generate the matching parameters.

In another embodiment the cataloger further stores histories of at least one of time, temperature and mode of operation information of the system with mismatches and heuristically processes the stored estimates and information to generate the matching parameters.

In another embodiment the mismatch estimator further comprises: a channelizer that partitions each of the at least two mismatched signals output by the analog-to-digital converters into channelized signals in response to a channel select signal wherein the channelized signals represent a selected frequency subband of the unmatched output signals of the analog-to-digital converters, wherein the gain estimator calculates gain estimates of the channelized signals, wherein the phase estimator calculates phase estimates of the channelized signals, and wherein the DC-offset estimator calculates DC-offset estimates of the channelized signals.

In another embodiment the phase estimator comprises: a plurality of variable phase shifters that adjust phases of the channelized signals in response to variable phase shift signals and generates phase shifted signals, a plurality of subtractors that subtract the phase shifted signals of respective variable phase shifters to generate difference signals, a plurality of level estimators that calculate the magnitudes of the difference signals and that generate phase difference signals, and a phase processor that processes the phase difference signals and generates phase estimate signals.

In another embodiment the phase processor processes the phase difference signals and generates the variable phase shift signals using an iterative optimization and generates phase estimate signals.

In another embodiment the level estimators generate phase difference signals by a running average of the squared amplitude of each of the difference signals.

In another embodiment the mismatch estimator comprises a gain and phase estimator that calculates gain estimates and phase estimates of the channelized signals.

In another embodiment the gain and phase estimator comprises: a plurality of variable gain and phase shifters that adjust gains and phases of the channelized signals in response to variable gain and phase shift signals and generates gain and phase shifted signals, a plurality of subtractors that subtract the gain and phase shifted signals of respective variable gain and phase shifters to generate difference signals, a plurality of cancellation estimators that calculate the magnitude of the vector cancellation of the difference signals and that generate vector cancellation level signals, and a gain and phase processor that processes the vector cancellation level signals and generates gain and phase estimate signals.

In another embodiment the gain and phase processor processes the vector cancellation level signals and generates variable gain and phase shift signals using an iterative optimization and generates the gain and phase estimate signals.

In another embodiment the gain and phase estimator comprises: a plurality of variable phase shifters that adjust a phase of the channelized signals in response to variable phase shift signals and generates phase shifted signals, a plurality of background calibration sequence level estimators that calculate the magnitude of the background calibration sequence signal to generate calibration sequence level signals, and a background calibration sequence processor that processes the calibration level sequence signals and generates gain and phase estimate signals.

In another embodiment the background calibration sequence processor processes the calibration level sequence signals and generates variable phase shift signals using an iterative optimization and generates gain and phase estimate signals.

In another aspect a multi-stage analog-to-digital converter compensates for mismatches in signals during normal operation. The multi-stage analog-to-digital converter comprises: a first analog-to-digital converter that converts an analog input signal into a corresponding first stage digital signal, an analog delay unit that delays the analog input signal to generate a delayed analog input signal, a first mismatch equalizer that compensates mismatches between the delayed analog input signal and a first stage analog signal during normal operation of the multi-stage analog-to-digital converter in response to first matching parameters and that outputs a first stage matched digital signal, a first digital-to-analog converter that converts the first stage matched digital signal to the first stage analog signal, a subtractor that subtracts the delayed analog input signal from the first stage analog signal to generate a residual analog signal, a second analog-to-digital converter that converts the residual analog signal into a corresponding second stage digital signal, a second mismatch equalizer that compensates mismatches between the first stage digital signal and the second stage digital signal output by the second analog-to-digital converter during normal operation of the multi-stage analog-to-digital converter in response to second matching parameters and that outputs a second stage matched digital signal, and a mismatch estimator that monitors the second stage digital signal during normal operation of the multi-stage analog-to-digital converter and that generates the first matching parameters indicating an amount of mismatch between the delayed analog input signal and the first stage analog signal and that generates the second matching parameters indicating an amount of mismatch between the first stage digital signal and the second stage digital signal, the mismatch estimator updating the first and second matching parameters during normal operation of the multi-stage analog-to-digital converter.

In one embodiment the mismatch estimator continually monitors the second stage digital signal and continually updates the first matching parameters and the second matching parameters during normal operation of the multi-stage analog-to-digital converter, and wherein the first and second mismatch equalizers adaptively compensate mismatches between the analog input signal and the first stage analog signal, and between the first stage digital signal and the second stage digital signal, respectively, during normal operation of the multi-stage analog-to-digital converter.

In another embodiment the multi-stage analog-to-digital comprises a signal level amplifier that amplifies the residual analog signal to generate a amplified residual analog signal and wherein the second analog-to-digital converter converts the amplified residual analog signal into the corresponding second stage digital signal.

In another embodiment the first matching parameters and second matching parameters comprise at least one of: a DC-offset parameter, a gain parameter, and a phase parameter.

In another embodiment the first mismatch equalizer comprises: a first coefficient generator that receives the first matching parameters and generates filter coefficients, a first digital signal processor that generates a first stage matched output signal in response to the filter coefficients, and an adder for adding a background calibration sequence signal to the first stage matched output to generate the first stage matched digital signal.

In another embodiment the second mismatch equalizer comprises: a second coefficient generator that receives the second matching parameters and generates filter coefficients, a second digital signal processor that generates a second stage matched output signal in response to the filter coefficients, and a subtractor for subtracting the background calibration sequence signal from the second stage matched output signal to generate the second stage matched digital signal.

In another embodiment the mismatch estimator comprises: a first gain and phase estimator that calculates gain estimates and phase estimates between the delayed analog input signal and the first stage analog signal, a second gain and phase estimator that calculates gain estimates and phase estimates between the first stage digital signal and the second stage digital signal, and wherein the mismatch estimator generates the first and second matching parameters in response to at least one of the gain estimates and the phase estimates of the first and second gain and phase estimators, respectively.

In another embodiment the mismatch estimator further comprises a cataloger that stores histories of at least one of the gain estimates and the phase estimates of the first and second gain and phase estimators, and heuristically processes the stored estimates to generate third matching parameters indicating an amount of mismatch between the delayed analog input signal and the first stage analog signal, and fourth matching parameters indicating an amount of mismatch between the first stage digital signal and the second stage digital signal.

In another embodiment the cataloger further stores histories of at least one of time, temperature and mode of operation information of the multi-stage analog-to-digital converter and heuristically processes the stored estimates and information to generate the third and the forth matching parameters.

In another embodiment the first gain and phase estimator comprises: a cancellation estimator that calculates the magnitude of the vector cancellation between the delayed analog input signal and the first stage analog signal, and that generates a vector cancellation level signal, a gain and phase processor that processes the vector cancellation level signal and generates gain and phase estimate signals, and wherein the first gain and phase processor processes the vector cancellation level signal and generates the first matching parameters using an iterative optimization.

In another embodiment the second gain and phase estimator comprises: a background calibration sequence level estimator that calculates the magnitude of a background calibration level sequence and generates a calibration sequence level signal, a background calibration sequence processor that processes the background calibration level sequence signal and generates gain and phase estimate signals, and wherein the background calibration sequence processor processes the background calibration level sequence signal and generates the second matching parameters using an iterative optimization.

In another aspect a method of compensating for mismatches in output signals of a system with mismatches during normal operation of the system with mismatches, comprises: monitoring at least two mismatched signals output by the system with mismatches during normal operation and generating matching parameters indicating an amount of mismatch between the at least two mismatched signals, the mismatch estimator updating the matching parameters during normal operation of the system with mismatches, and compensating mismatches in the mismatched signals output by the system with mismatches during normal operation of the system with mismatches in response to the matching parameters.

In one embodiment monitoring comprises continually monitoring the at least two mismatched signals output by the system with mismatches and wherein updating comprises continually updating the matching parameters during normal operation of the system with mismatches, and wherein compensating comprises adaptively compensating mismatches in the mismatched signals output by the system with mismatches during normal operation of the system with mismatches.

In another embodiment the matching parameters comprise at least one of: a DC-offset parameter, a gain parameter, and a phase shift parameter.

In another embodiment compensating mismatches in the mismatched signals comprises compensating mismatches in at least two mismatched signals as a function of frequency.

In another embodiment compensating mismatches further comprises: receiving matching parameters and generating filter coefficients and compensating for gain and phase mismatches in response to the filter coefficients.

In another embodiment compensating mismatches further comprises at least one of: calculating gain estimates of the at least two mismatched signals output by the system with mismatches, calculating phase estimates of the at least two mismatched signals output by the system with mismatches, calculating DC-offset estimates of the at least two mismatched signals output by the system with mismatches, and wherein generating the matching parameters is in response to at least one of the gain estimates, the phase estimates and the DC-offset estimates.

In another embodiment monitoring further comprises storing histories of at least one of the gain estimates, the phase estimates and the DC-offset estimates, and heuristically processing the stored estimates to generate the matching parameters.

In another embodiment monitoring further comprises storing histories of at least one of time, temperature and mode of operation information of the system with mismatches and heuristically processing the stored estimates and information to generate the matching parameters.

In another embodiment monitoring further comprises: selecting a frequency band of the at least two mismatched signals to be partitioned of the system with mismatches, partitioning each of the at least two mismatched signals output by the system with mismatches into channelized signals wherein the channelized signals represent frequency bands of the unmatched output signals of the system with mismatches, wherein calculating gain estimates comprises calculating gain estimates of the channelized signals, wherein calculating phase estimates comprises calculating phase estimates of the channelized signals, and wherein calculating DC-offset estimates comprises calculating DC-offset estimates of the channelized signals.

In another embodiment calculating phase estimates further comprises: adjusting phases of the channelized signals in response to variable phase shift signals and generating difference signals, subtracting the phase shifted signals of respective variable phase shifters and generating phase difference signals, calculating the magnitudes of the difference signals and generating phase difference signals, and processing the phase difference signals and generating phase estimates.

In another embodiment processing the phase difference signals further comprises processing the phase difference signals comprises generating the variable phase shift signals using an iterative optimization and generating phase estimate signals.

In another embodiment calculating the magnitudes of the difference signals further comprises generating the phase difference signals by a running average of the squared amplitude of each of the difference signals.

In another embodiment monitoring further comprises calculating gain estimates and phase estimates of the channelized signals.

In another embodiment calculating gain estimates and phase estimates of the channelized signals further comprises: adjusting gains and phases of the channelized signals in response to variable gain and phase shift signals and generating gain and phase shifted signals, subtracting the gain and phase shifted signals of respective variable gain and phase shifters and generating difference signals, calculating the magnitude of the vector cancelation of the difference signals and generating vector cancellation level signal, and processing the vector cancellation level signals and generating gain and phase estimate signals.

In another embodiment processing the vector cancellation level signals and generating gain and phase estimate signals further comprises processing the vector cancellation level signals and generating variable gain and phase shift signals using an iterative optimization and generating gain and phase estimate signals.

In another embodiment calculating gain estimates and phase estimates of the channelized signals further comprises: adjusting a phase of the channelized signals in response to variable phase shift signals and generating phase shifted signals, calculating the magnitude of the background calibration sequence signal and generating calibration sequence level signals, and processing the calibration level sequence signals and generating gain and phase estimate signals.

In another embodiment processing the calibration level sequence signals and generating gain and phase estimate signals further comprises processing the calibration level sequence signals and generating variable phase shift signals using an iterative optimization and generating gain and phase estimate signals.

In another aspect a method for compensating mismatches in a system with mismatches comprises: monitoring at least two mismatched signals output by the system with mismatches, determining amplitudes of the at least two mismatched signals, determining frequency content of the at least two mismatched signals, during normal operation of the system with mismatches, determining whether the at least two mismatched signals are suitable for an accurate estimation of at least one of: gain mismatch, phase mismatch, and DC-offset based on the determined amplitudes and frequency content of the at least two mismatched signals, during normal operation of the system with mismatches, estimating at least one of the gain mismatch, the phase mismatch, and the DC-offset between the at least two mismatched signals, and compensating for mismatches in the at least two mismatched signals based on the estimated at least one of the gain mismatch, the phase mismatch, and the DC-offset between the at least two mismatched signals.

In one embodiment the method for compensating mismatches in a system with mismatches further comprises determining whether the estimated at least one of the gain mismatch, the phase mismatch, and the DC-offset are within factory calibration values prior to compensating.

In another embodiment the method for compensating mismatches in the system with mismatches comprises heuristically compensating. The method for compensating mismatches in a system with mismatches further comprises: storing the estimated at least one of the gain mismatch, the phase mismatch, and the DC-offset in a mismatch catalog, searching the mismatch catalog for relevant estimate measurements, extracting relevant estimate measurements, calculating matching parameters based on the extracted measurements, and compensating for mismatches in the at least two mismatched signals based on the calculated matching parameters.

In another embodiment compensating mismatches in the system with mismatches further comprises interpolating the extracted relevant estimate measurements to generate interpolated measurements, and wherein calculating matching parameters is further based on the interpolated measurements.

BRIEF DESCRIPTION OF THE DRAWINGS

The foregoing and other objects, features and advantages of the embodiments of the invention will be apparent from the more particular description of embodiments of the invention, as illustrated in the accompanying drawings in which like reference characters refer to the same parts throughout the different views. The drawings are not necessarily to scale, emphasis instead being placed upon illustrating the principles of the invention.

In the drawings:

FIG. 14 is a detailed block diagram of an adaptive mismatch estimator illustrated in FIG. 11 in accordance with an embodiment of the present invention;

FIG. 15 is a detailed block diagram of a gain and phase estimator illustrated in FIG. 14 in accordance with an embodiment of the present invention;

FIG. 16 is a detailed block diagram of another gain and phase estimator illustrated in FIG. 14 in accordance with an embodiment of the present invention;

DETAILED DESCRIPTION OF EMBODIMENTS

Figure 1:
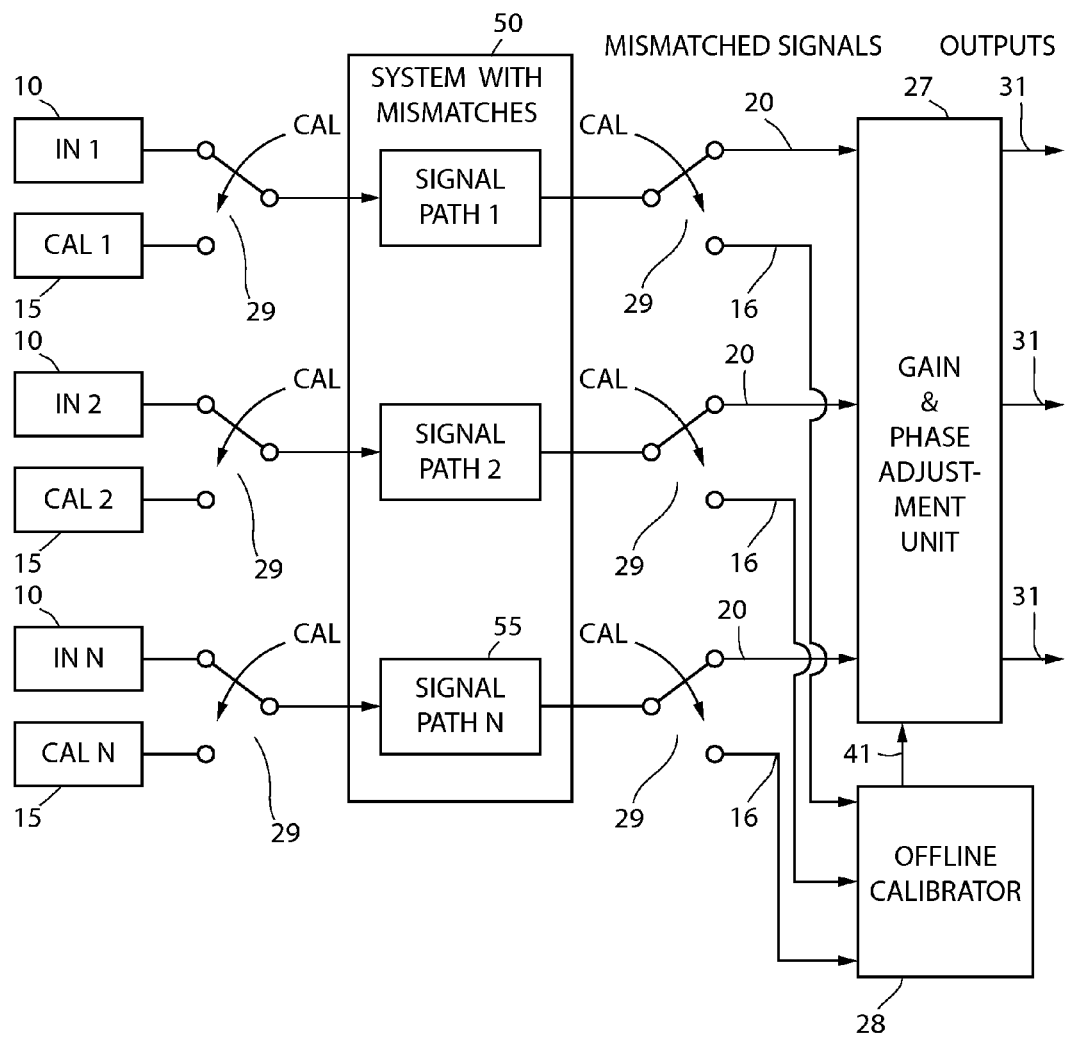
FIG. 1 is a block diagram of a conventional matching system with offline calibration.

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

In one aspect, embodiments of the present invention are directed to a compensator for adaptively compensating mismatches, such as gain mismatches, phase mismatches, and DC-offset. The compensator includes an adaptive mismatch estimator for measuring mismatches and a mismatch equalizer for correcting mismatches without requiring interruption of the normal operation of the system. Background adaptive mismatch estimation and compensation techniques are effective for tracking and compensating for parameters that vary over frequency, temperature, and time. Numerous applications benefit from precise, stable compensation of mismatches between multiple signals.

One application that can benefit from mismatch compensation is high-speed, high-resolution analog-to-digital conversion systems that employ multiple channels or stages of conversion to improve the system performance. System performance is improved when mismatches between the multiple channels or stages are accurately compensated.

High-speed, high-resolution analog-to-digital conversion is a critical technology in many modern electronic systems, such as radar systems and digital receivers for wireless communications. In general, high-speed, high-resolution converters enable wide bands of analog data to be converted to digital form to be processed more accurately and efficiently than is possible in analog form. Systems can be updated as requirements change and new standards arise by simply updating software to change the digital signal processing. A high-performance converter can significantly reduce the cost, size, and power consumption of systems by eliminating much of the analog front-end RF circuitry while improving versatility and performance.

Analog-to-digital converter performance is typically quantified by two parameters, speed (in samples per second) and resolution (in bits). Designers face the challenge of trading off the resolution of the conversion with its speed. Using multiple analog-to-digital converters with background adaptive mismatch estimation and compensation techniques, the speed and resolution of the conversion can be increased over the conventional Time-Interleaved array conversion techniques (also called "Ping-Pong" or "Round-Robin" methods). Further, by eliminating much of the front-end analog electronics in the RF signal chain, analog-to-digital conversion architectures with adaptive mismatch compensators in accordance with embodiments of the present invention reduce the size, power, and cost of advanced digital receivers, radar systems, cellular base station receivers, adaptive array processing, digital beam-forming, and other RF systems by performing more of the processing digitally in reconfigurable software.

Interleaving converters increases the Nyquist bandwidth many fold, but the interleaving process introduces very large distortion artifacts (typically about −40 dBc). This artifact is not a harmonic or an intermodulation product; it is a separate type of signal-related distortion caused by gain and phase mismatches between the converters in the array. Embodiments of the present invention can reduce this interleaving artifact by accurately matching the gain and phase of the converters. The distortion artifact can be reduced to be approximately the same level as the other ADC distortion, such as harmonic and intermodulation products, so that the interleaving artifact is not a limiting factor in the dynamic range performance.

ADC manufacturers such as Analog Devices have been incorporating high-precision, analog front-end sampling circuitry in their ADC chips, which extends the sampling bandwidth of the device by up to six to eight times the Nyquist bandwidth. Therefore, commercially-available chips such as these can be used with systems and methods of the embodiments of the present invention to improve the speed of the conversion, for example, by up to six or eight times. Wideband analog sample-and-hold or track-and-hold circuitry can be incorporated in the architecture to improve the bandwidth even more. Also, linearity error compensation techniques can be employed to extend the dynamic range at high intermediate frequencies (IF) even further.

An embodiment of the present invention uses a combination of time-division multiplexing to split the input signal into N parallel channels, wherein each parallel channel can be digitized by its corresponding ADC in the array at 1/N the effective sample rate of the system. Multirate digital filters can be used to compensate for mismatches between the channel ADC outputs to accurately reconstruct the digitized signal. Multirate digital filtering in this manner increases the speed of the conversion by a factor of N by accurately compensating for analog mismatches (e.g., gain mismatch, phase mismatch, and DC-offset caused by imprecise analog component values, line length mismatches, and other variations in the analog front-end electronics) which otherwise limit the resolution of the system and which prohibit existing parallel architectures from achieving high-resolution. Embodiments of the present invention provide high-resolution performance by accurately correcting the mismatches between the converters across the entire frequency bandwidth to a high level of precision using adaptive mismatch compensator systems.

An adaptive mismatch compensator system and method in accordance with embodiments of the present invention continuously updates the filter coefficients in the background to provide optimal performance over many operating conditions. In certain embodiments, adaptive mismatch compensation can employ a combination of two methods: (1) a mismatch estimation process to measure the gain and phase mismatches and DC-offset, and (2) a heuristic process that intelligently combines recent measurements to provide consistent performance over time, frequency, and environmental conditions. The background adaptive mismatch compensation can be performed in an embedded processor that monitors the incoming signals without interrupting the normal operation of the system. In general, the normal operation of the system is the mode of operation when the system is continuously processing signals for its intended application. For example, switching the mode of operation to a calibration mode wherein the inputs are switched to known calibration signals and the performance is measured would interrupt the normal operation of the system.

In certain embodiments, the mismatch estimation portion can calculate a number of channel-to-channel measurements of the incoming signal to deduce the DC-offset of each signal, the gain mismatch between signals, and the phase mismatch between the signals. Processing a small snapshot of data (e.g., 8192 samples) from each signal can be sufficient to provide very accurate estimations of the mismatches in a short amount of time (e.g., a few seconds in a standard embedded processor in a field programmable gate array).

In general, embodiments of the adaptive mismatch compensator can react instantaneously to changes in input frequency (e.g., frequency hopping) because they can use digital filters with responses that vary with input frequency. Embodiments of the adaptive mismatch compensator can gather and analyze the data to estimate mismatches, combine current estimates with past estimates, and swap in new filter coefficients to update the adaptive mismatch equalizer. This process can be performed in a short amount of time (e.g. every few seconds or faster in a standard embedded processor in a field programmable gate array). Mismatches that drift over time and temperature generally change more slowly (e.g., on the order of tens of seconds or minutes). Therefore, the processing can update itself fast enough to compensate for these types of changes. Conventional systems are taken offline and recalibrated on the order of hours, and therefore cannot track mismatches that change faster than this. Embodiments of the adaptive mismatch compensator can continually monitor mismatched signals and continually update itself during normal operation of the system and without taking it offline.

Conventional methods of mismatch estimation rely on switching in known calibration tones and measuring the relative gains and phases, for example, using the Fast Fourier Transform (FFT). Each FFT bin provides an amplitude and phase of the signal with frequency content corresponding to that FFT bin. Embodiments of the present invention do not require switching in known calibration tones or FFT analysis. Instead, embodiments of the present invention can use an adaptive estimation method that evaluates channel-to-channel differences and successively adjusts the phase shift of mismatched signals until the channel-to-channel differences are equal, indicating phase matching has been achieved.

A heuristic process in accordance with embodiments of the present invention can analyze the amplitude and frequency content of the current signal, monitor the current time and temperature, catalog the current set of measurements, and intelligently combine or discard recent measurements, thereby providing stable performance. These measurements can be used to optimize the mismatch equalizer for optimal performance, and a history of measurements can be used to accurately compensate for mismatches that vary over frequency. This approach allows the compensated system to provide accurate performance over a wide frequency band, including signals that rapidly change in frequency or have frequency components occurring simultaneously and at different frequencies. Systems and methods in accordance with embodiments of the present invention can update the processing, in one embodiment, as quickly as necessary to track changes, even in rapidly changing environments. In an embodiment, new filter parameters can be loaded seamlessly within one clock cycle so that data flow is not interrupted.

Applications of high-resolution, high-speed data conversion may include, but are not limited to, the following: multi-beam adaptive digital beamforming array transceivers, advanced radar systems, smart radios for wireless communications (cellular and satellite), wideband electronic warfare transceivers, general test equipment such as oscilloscopes, spectrum analyzers, network analyzers, special test equipment, wide bandwidth modems, software-defined radios, or anti-jam GPS receivers.

Figure 2:
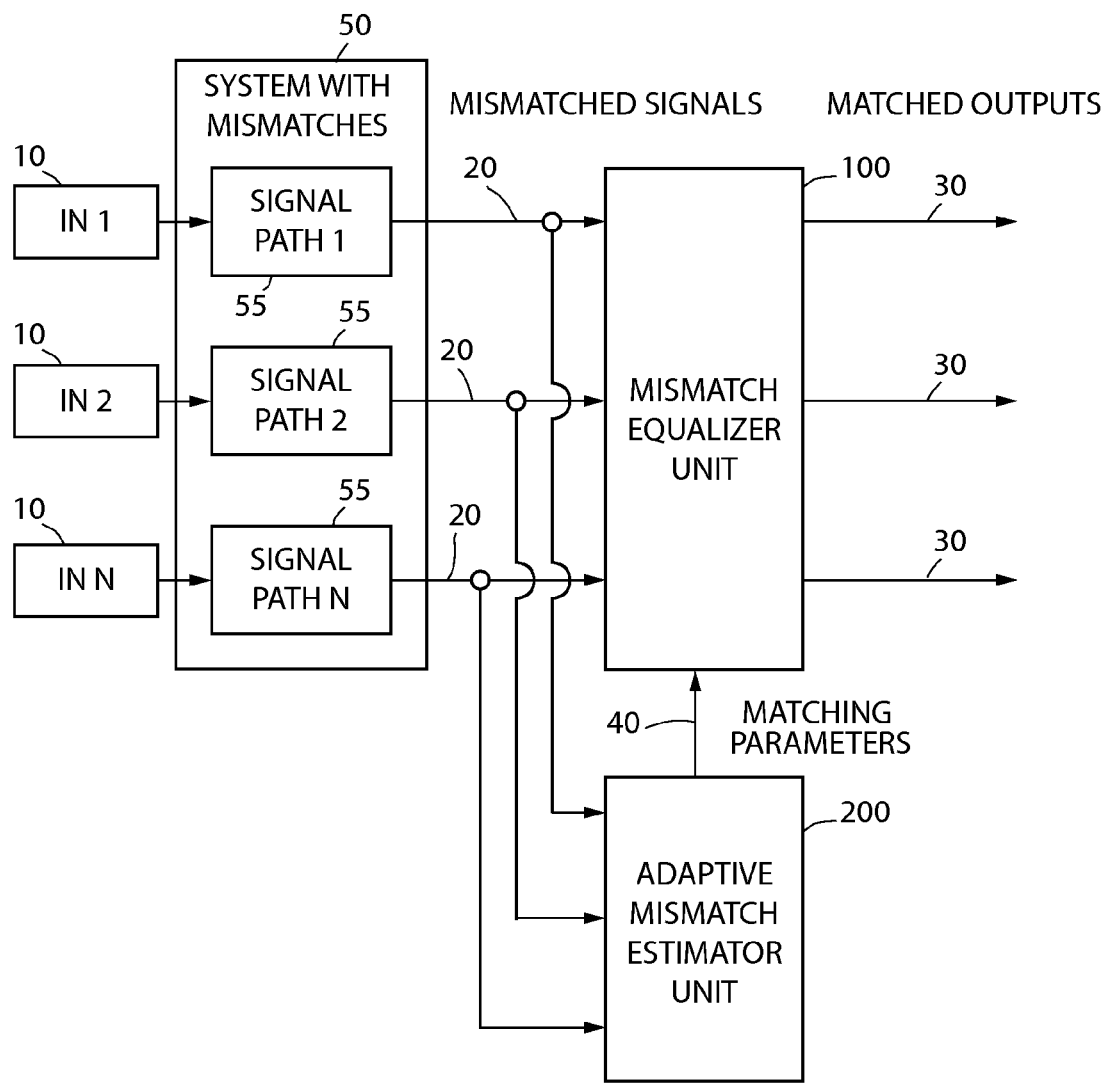
FIG. 2 is a block diagram of a compensator system using a mismatch equalizer and an adaptive mismatch estimator in accordance with an embodiment of the present invention.

FIG. 2 is a block diagram of a compensator system using a mismatch equalizer and an adaptive mismatch estimator in accordance with an embodiment of the present invention. A compensator system in accordance with embodiments of the present invention consists of a system with mismatches 50, an adaptive mismatch estimator unit 200 that determines the amount of mismatch between mismatched signals 20, and a mismatch equalizer unit 100 that compensates for the mismatches in the system with mismatches 50. The system with mismatches 50 processes the input signals 10 provided on a plurality of signal paths 55, wherein each signal path 55 introduces undesired mismatches, and outputs mismatched signals 20. The adaptive mismatch estimator unit 200 receives as input the mismatched signals 20 and estimates the amount of the mismatches with regard to gain, phase shift, or DC-offset. Matching parameters 40 are generated by the adaptive mismatch estimator unit 200 in response to the current estimates of mismatches, and optionally a history of past estimates of mismatches, such that the mismatches can be effectively corrected by the mismatch equalizer unit 100, and the matching parameters 40 are output to the mismatch equalizer unit 100. In response to the matching parameters 40, the mismatch equalizer unit 100 processes the mismatched signals 20, corrects mismatches in the mismatched signals 20, and outputs matched signals 30. The mismatch equalizer unit 100 produces matched signals 30 that are the matched versions of input signals 10, thereby compensating for the undesired mismatches introduced by the system with mismatches 50.

Figure 3:
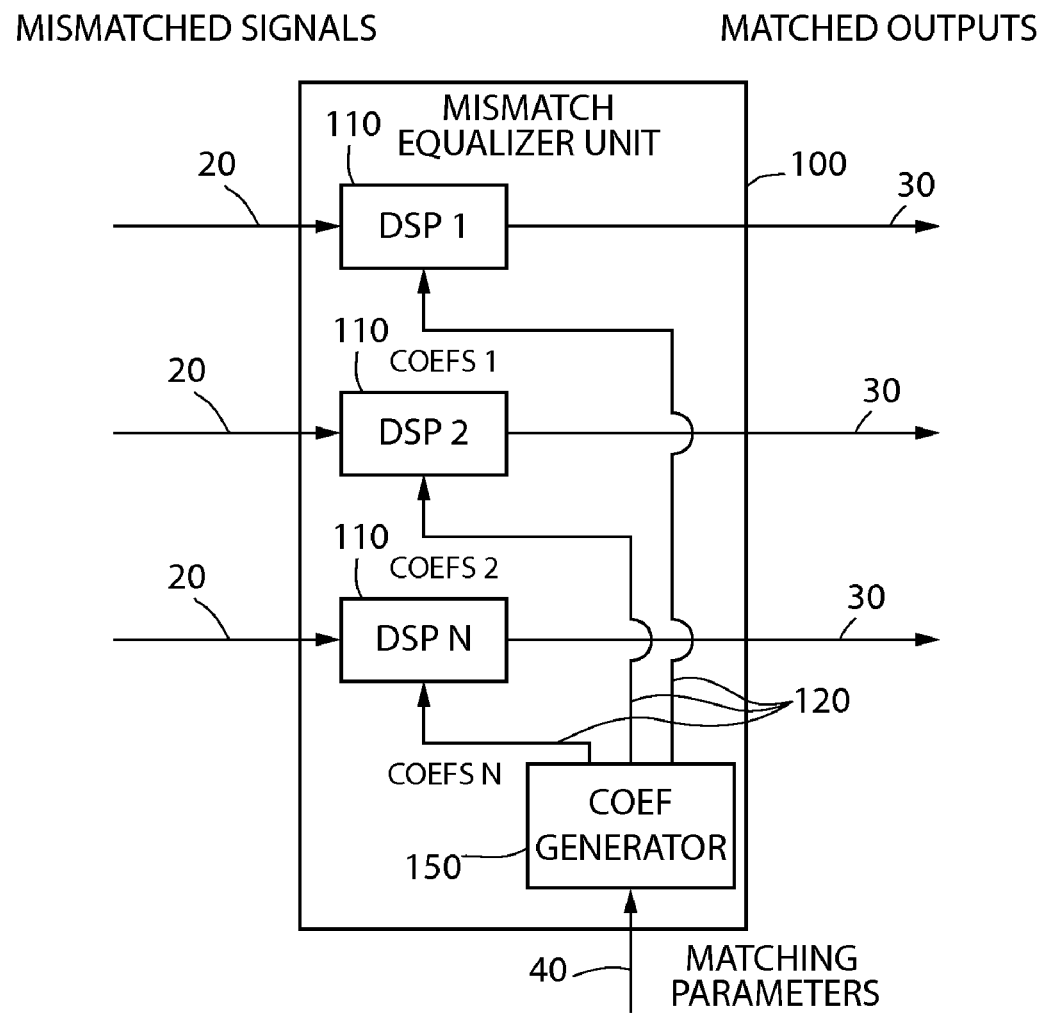
FIG. 3 is a block diagram of a mismatch equalizer portion of a compensator system in accordance with an embodiment of the present invention.

FIG. 3 is a block diagram of a mismatch equalizer unit 100 of a compensator system in accordance with an embodiment of the present invention. In this embodiment, a mismatch equalizer unit 100 includes a plurality of digital signal processors 110 and a coefficient generator 150. The digital signal processors 110 can be implemented, in one embodiment, as digital finite impulse response filters with a transfer function whose gain and phase varies with input frequency. This allows the digital signal processors to compensate for gain and phase mismatches that vary with input frequency. A coefficient generator 150 receives as its input the matching parameters 40 supplied by the adaptive mismatch estimator unit 200, and translates the matching parameters 40 into appropriate coefficients 120 for signal processing such that the digital signal processors 110 accurately correct the unmatched signals 20 and output matched signals 30.

Figure 4:
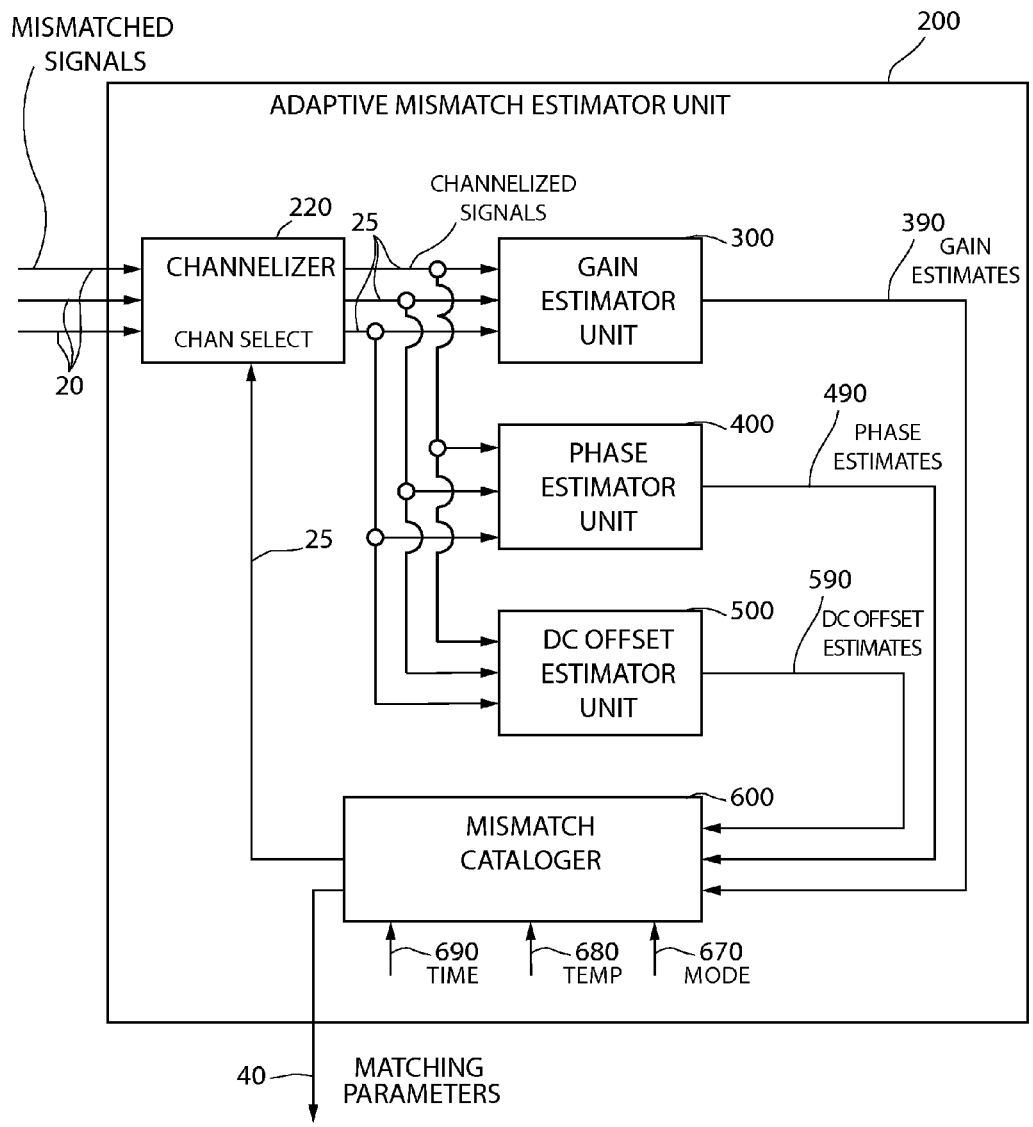
FIG. 4 is a block diagram of an adaptive mismatch estimator unit of a compensator system in accordance with an embodiment of the present invention.

FIG. 4 is a block diagram of an adaptive mismatch estimator unit 200 of a compensator system in accordance with an embodiment of the present invention. An adaptive mismatch estimator unit 200 includes an optional channelizer 220 to partition the incoming unmatched signals 20 into one or more frequency bands to allow for estimation of mismatches as a function of frequency. The optional channelizer 220 outputs channelized signals 25 that represent a selected frequency band of the corresponding mismatched signals 20. The channelizer receives a channel select signal 25 that selects the desired frequency band for the channelizer 220 to output in the channelized signals 25. A channelizer 220 can be implemented, in one embodiment, using linear phase finite impulse response (FIR) digital filters with low-pass, band-pass, or high-pass frequency response characteristics. Mismatched channelized signals 25 are input to at least one of a gain estimator unit 300, a phase estimator unit 400, and a DC-offset estimator unit 500. The gain estimator unit 300 calculates a gain estimate 390 for each of the channelized signals 25. Similarly, a phase estimator unit 400 calculates a phase shift estimate 490 for each of the channelized signals 25. A DC-offset estimator unit 500 calculates a DC-offset estimate 590 for each of the channelized signals 25. A separate gain estimate 390, phase shift estimate 490, and DC-offset estimate 590 are output for each selected frequency band. This allows the adaptive mismatch estimator unit 200 to estimate gain, phase shift, and DC-offset that can vary with varying input frequency.

Still referring to FIG. 4, an optional mismatch cataloger 600 can be used to catalog a designated history of various measurements, including, but not limited to, gain estimates 390, phase estimates 490, DC-offset estimates 590, mode of operation 670, temperature 680, and time 690.

The mode of operation 670 corresponds to the current configuration of the system with mismatches 50, including, but not limited to, current bandwidth, center frequency, sample rate, resolution, dither level, dither frequency content, pre-amplification gain, or signal path selection. This allows the cataloger 600 to catalog a history of measurements for the different operating modes of the system with mismatches 50 so that if the operating mode changes, then the processing can be updated instantly without having to wait for new estimates to be generated.

The temperature 680 corresponds to the thermal temperature of one or more critical devices in the system with mismatches 50 whose characteristics can vary with ambient temperature. This allows the cataloger 600 to catalog a history of measurements for different temperatures so that if the temperature changes, then the processing can be updated instantly without having to wait for new estimates to be generated.

The time 690 corresponds to a time stamp indicating when certain estimates were measured. This allows the cataloger 600 to catalog a history of measurements for different times and combine repeated measurements at different times for a more accurate estimate.

Figures 17, 18:
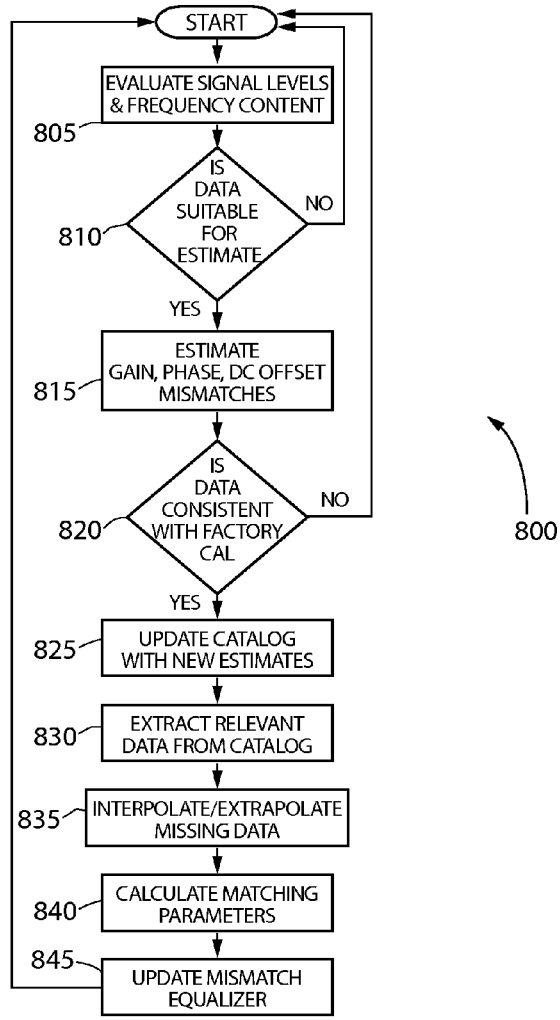
FIG. 17 is a data table of a mismatch catalog in accordance with an embodiment of the present invention.
FIG. 18 is a flow chart showing a process for heuristically compensating mismatches in accordance with the present invention.

FIG. 17 is a data table that depicts a mismatch catalog that is managed by a mismatch cataloger 600. In various embodiments, the mismatch cataloger can be implemented using a number of different systems, including but not limited to a random access memory (RAM), a non-volatile memory such as flash memory, and embedded memory in a field programmable gate array (FPGA). As described in detail herein, the mismatch cataloger 600 can record a number of different measurements or samples to allow for accurate interpolation or extrapolation of the various matching parameters 40, given the system's current operating mode, current temperature, other current conditions, and over a range of frequencies.

Figure 5:
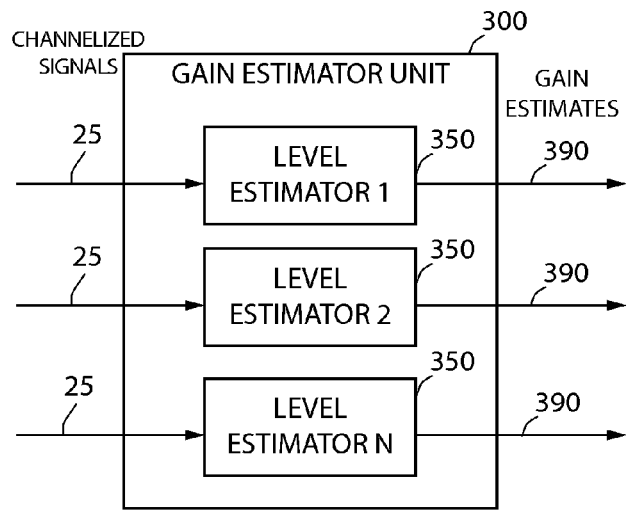
FIG. 5 is a detailed block diagram of a gain estimator unit of the adaptive mismatch estimator illustrated in FIG. 4 in accordance with an embodiment of the present invention.
Figure 6:
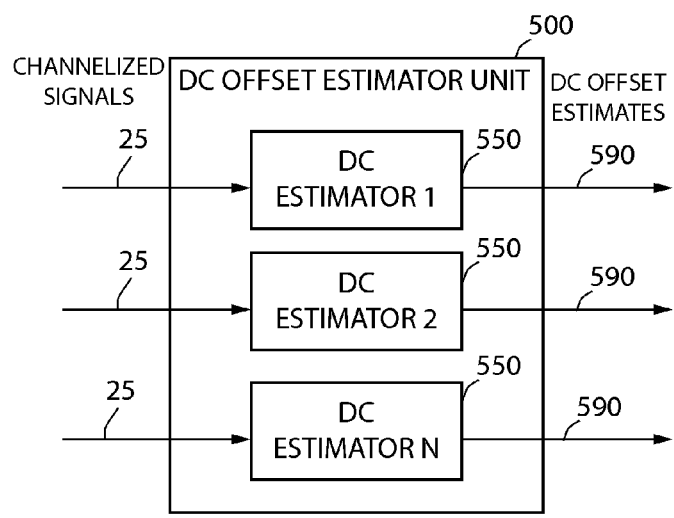
FIG. 6 is a detailed block diagram of a DC-offset estimator unit of the adaptive mismatch estimator illustrated in FIG. 4 in accordance with an embodiment of the present invention.

FIG. 5 is a detailed block diagram of a gain estimator unit 300 of the adaptive mismatch estimator of FIG. 4 in accordance with one embodiment of the present invention. A gain estimator unit 300 in accordance with embodiments of the present invention includes a plurality of level estimators 350 to calculate gain estimates 390 of the channelized signals 25. The level estimators 350 can be implemented, in one embodiment, as a running average of the squared amplitude of each of the channelized signals 25. The running average can be implemented, in one embodiment, in a digital signal processor, a field programmable gate array, or an integrated circuit with dedicated logic FIG. 6 is a detailed block diagram of a DC-offset estimator unit 500 of the adaptive mismatch estimator of FIG. 4 in accordance with one embodiment of the present invention. A DC-offset estimator unit 500 can include a plurality of DC-offset estimators 550 to calculate DC-offset estimates 590 of the channelized signals 25. The DC-offset estimators 550 can be implemented, in one embodiment, as a running average of the amplitude of each of the signals 25. The running average can be implemented, in one embodiment, in a digital signal processor, a field programmable gate array, or an integrated circuit with dedicated logic.

Figure 7:
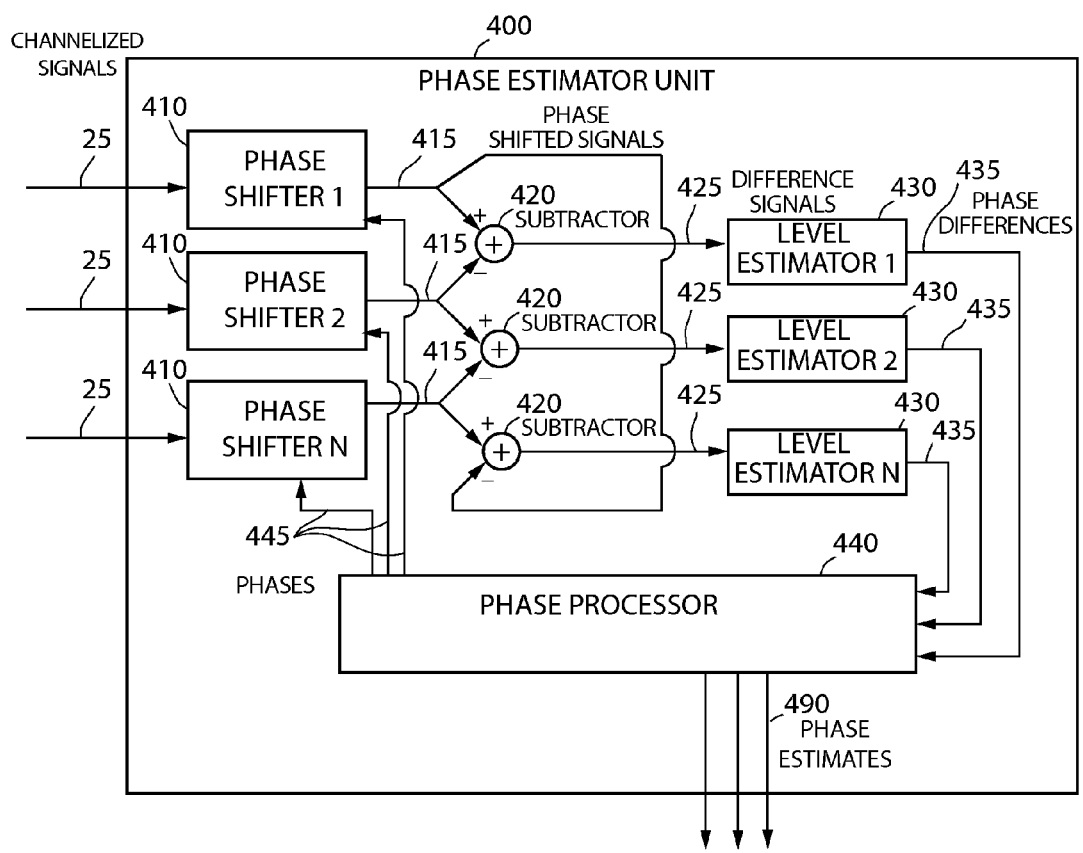
FIG. 7 is a detailed block diagram of a phase estimator unit of the adaptive mismatch estimator illustrated in FIG. 4 in accordance with an embodiment of the present invention.

FIG. 7 is a detailed block diagram of a phase estimator unit 400 of the adaptive mismatch estimator of FIG. 4 in accordance with an embodiment of the present invention. A phase estimator unit 400 can include a plurality of variable phase shifters 410 that adjust the phase of the input channelized signals 25 to produce phase shifted signals 415. The output signals of the phase shifters 410 can be applied to a plurality of subtractors 420 to produce a plurality of difference signals 425, which can represent the amplitude differences between the phase-shifted signals 415. Level estimators 430 can be used to calculate the magnitudes of the difference signals 425, which are represented in the output phase differences 435. These level estimators 430 can be implemented, in one embodiment, as a running average of the squared amplitude of each of the difference signals 425. The running average can be implemented, in one embodiment, in a digital signal processor, a field programmable gate array, or an integrated circuit with dedicated logic. A phase processor 440 compares each of the phase differences 435 to determine if the corresponding phase shifted signals 415 are currently phase matched. The phase shifted signals 415 can be considered to be matched when all of the phase differences 435 are approximately equal. When the phase differences 435 are not equal, the phase processor 440 can successively adjust the phase shifts 445 using, in one embodiment, an iterative optimization, such as Newton's Method, until the phase differences 435 are approximately equal. The phase shifters 410 can be implemented, in one embodiment, as finite impulse response digital filters, and the variable phase shift of the phase shifters 410 can be adjusted by the phase processor 440 by changing the filter coefficients to implement the desired phase shifts 445. The resulting phase estimates 490 are, in one embodiment, representative of the values of the variable phase shifts 445 that cause the phase differences 435 to be approximately equal.

Figure 8:
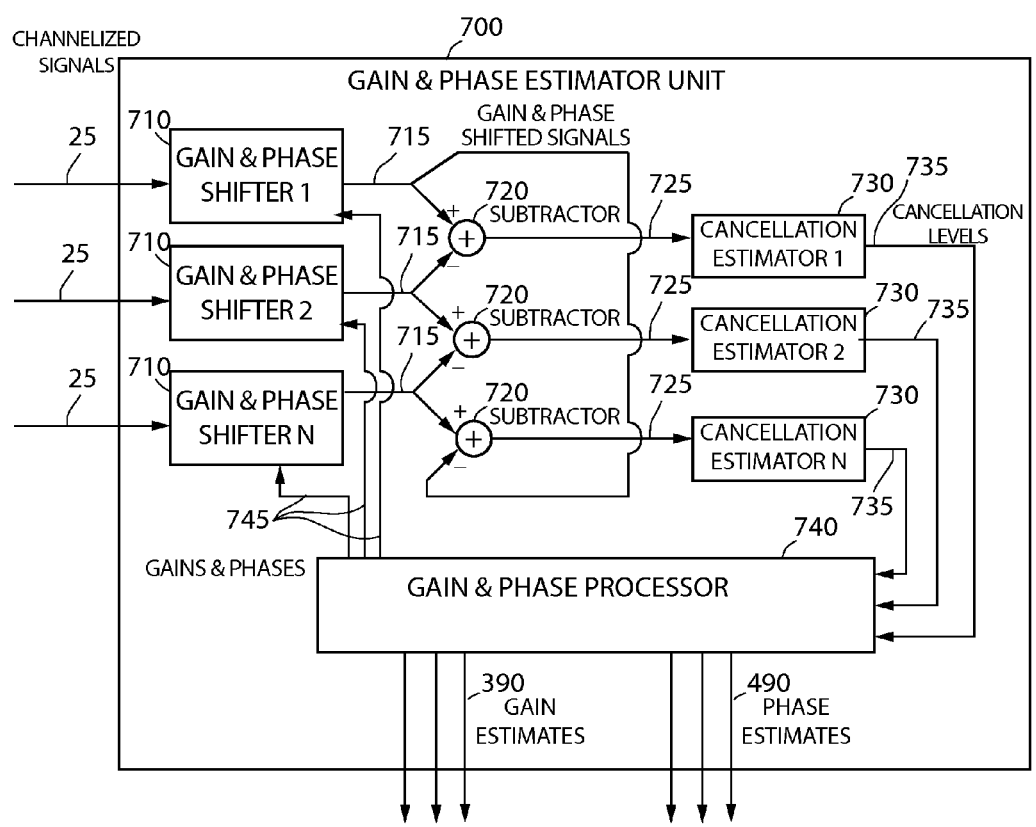
FIG. 8 is a block diagram of a gain and phase estimator unit of the adaptive mismatch estimator illustrated in FIG. 4 in accordance with an embodiment of the present invention.

FIG. 8 is a block diagram of a combined gain and phase estimator unit 700 of the adaptive mismatch estimator of FIG. 4 in accordance with another embodiment of the present invention. A gain and phase estimator unit 700 can include a plurality of variable gain and phase shifters 710 to precisely adjust the gain and phase of the input channelized signals 25 to produce gain and phase shifted signals 715. The gain and phase shifters 710 can be implemented, in one embodiment, as finite impulse response digital filters, and the variable gain and phase shift 745 of the gain and phase shifters 410 can be adjusted by the gain and phase processor 740 by changing the filter coefficients to implement the desired gain and phase shifts 745. The outputs of the gain and phase shifters 710 are applied to a plurality of subtractors 720 to produce difference signals 725, which represent the vector cancellation of the gain and phase shifted signals 715. Cancellation estimators 730 can be used to calculate the vector cancellation levels 735 of the difference signals 725. These cancellation estimators 730 can be implemented, in one embodiment, as a running average of the squared amplitude of each of the difference signals 725. Alternatively, cancellation estimators 730 can include frequency selective filtering to estimate the level of cancellation of signals over a particular frequency band. A gain and phase processor 740 analyzes the vector cancellation levels 735 and successively adjusts the gain and phase shifts 745, using, in one embodiment, an iterative optimization, such as Newton's Method until the vector cancellation levels 735 are minimized. The cancellation levels 735 are representative of the magnitude of the difference signals 725. Two gain and phase shifted signals 715 can be considered to be matched in gain and phase shift if, when one signal is subtracted 720 from the other, the magnitude of the difference signal 725 is at a minimum. The final gain estimate 390 and phase estimate 490 corresponding to each channelize input signal 25 are representative of the value of the variable gain and phase shift 745 that minimize the corresponding cancellation level 735.

Figure 9:
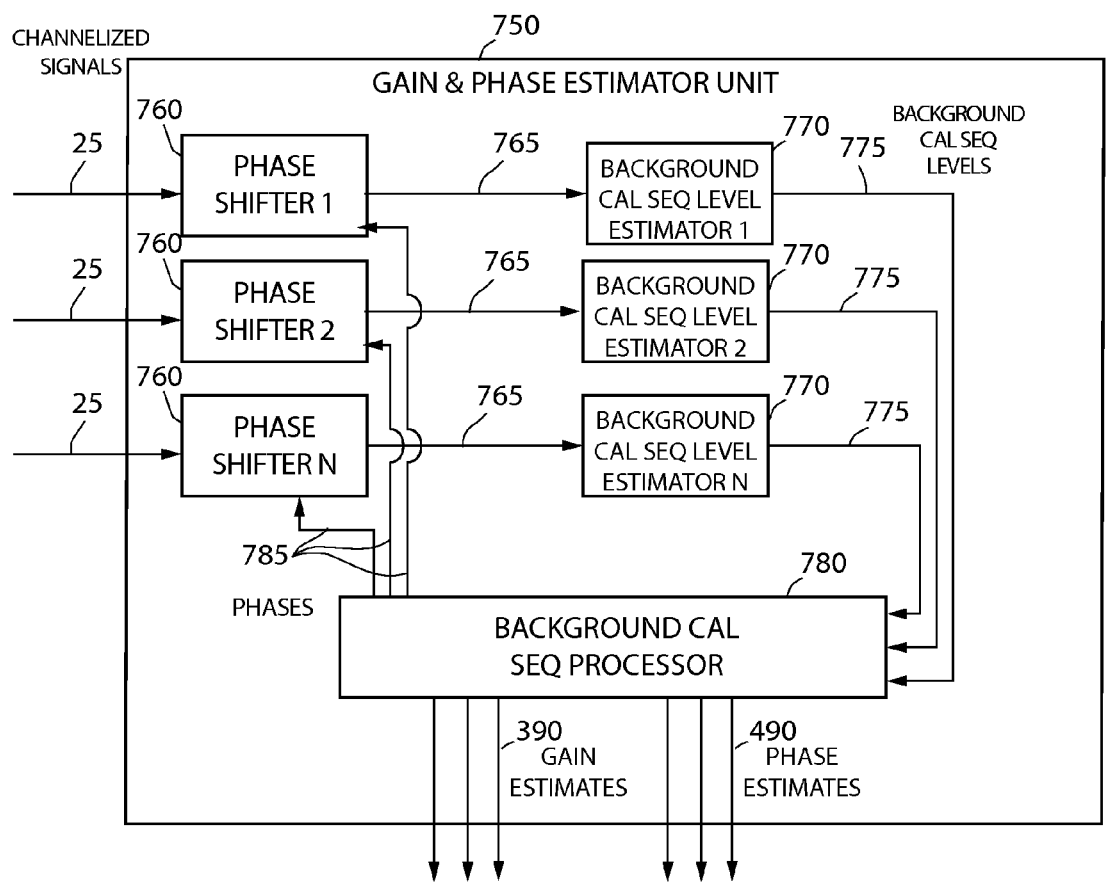
FIG. 9 is a block diagram of a gain and phase estimator unit of the adaptive mismatch estimator illustrated in FIG. 4 in accordance with another embodiment of the present invention.

FIG. 9 is a block diagram of a combined gain and phase estimator unit 750 of the adaptive mismatch estimator of FIG. 4 in accordance with another embodiment of the present invention. A gain and phase estimator unit 750 can include a plurality of variable phase shifters 760 to precisely adjust the phase of the input channelized signals 25 to produce phase shifted signals 765. The outputs of the phase shifters 760 are applied to background calibration sequence level estimators 770. A background calibration sequence signal can, in one embodiment, be added to the system inputs 10 shown in FIG. 2. A background calibration sequence signal, in one embodiment, can be generated with a random number generator and stored in a memory device, such as a read only memory (ROM). The background calibration sequence signal can be read from the memory device and added to each of the system inputs 10 with a digital adder that combines the system inputs 10 and the background calibration sequence signal such that the system inputs 10 include the background calibration sequence signal. Referring back to FIG. 9, the magnitude of the calibration sequence signal can then be evaluated with the level estimators 770. Since the background calibration sequence signal is statistically unrelated to any input signals 10, its detected level is largely unaffected by the current input signals 10.

Referring to FIG. 2, the background calibration sequence signal can be subtracted from the matched signals 30 so that it does not adversely affect the system output. Referring back to FIG. 9, level estimators 770 can be implemented, in one embodiment, via a running average of the multiplicative product of the background calibration sequence signal and the phase shifted signals 765. The running average can be implemented, in one embodiment, in a digital signal processor, a field programmable gate array, or an integrated circuit with dedicated logic. A background calibration sequence processor 780 analyzes the background calibration sequence levels 775 and successively adjusts the phase shifts 785, using, in one embodiment, an iterative optimization, such as Newton's Method, until the calibration sequence levels 775 are maximized. The background calibration sequence levels 775 are representative of the relative gain between the background calibration sequence and the phase shifted signals 765. The phase shifted signals 765 can be considered to be phase matched with the background calibration sequence signal when the background calibration sequence levels 775 are maximized during the iterative optimization. The phase estimates 490 are equal to the value of the variable phase shifts 785 that maximize the background calibration sequence levels 775. The gain estimates 390 are equal to the maximized value of the background calibration sequence levels 775. A benefit of this embodiment of a gain and phase estimator 750 is that it uses a background calibration sequence signal to continually monitor changes in the gain and phase mismatches without necessitating taking the system offline. The background calibration sequence signal does not interfere with the normal operation of the system because it can be subtracted from the output as described above.

Figure 10:
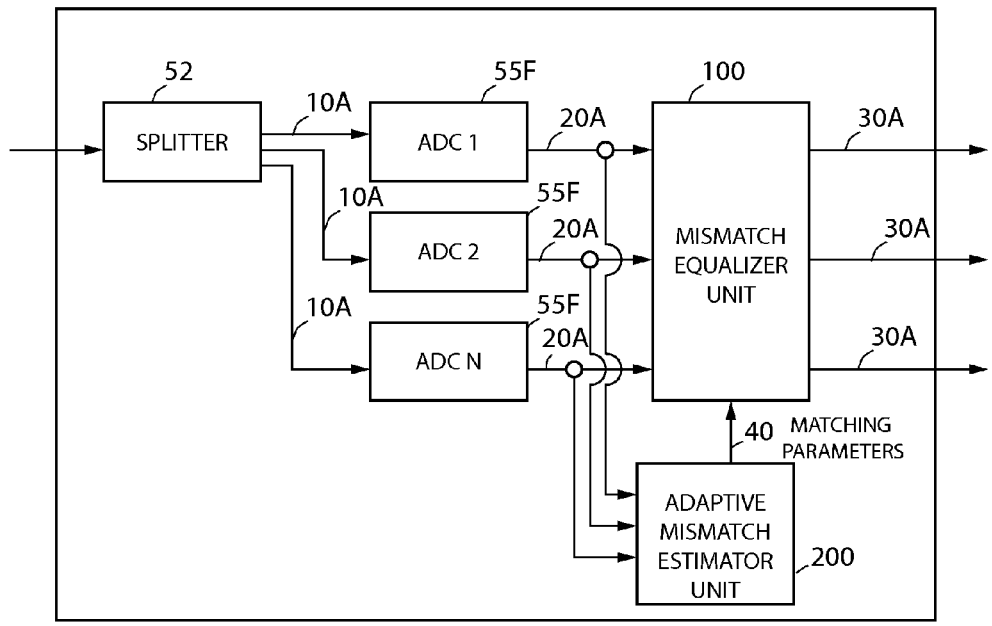
FIG. 10 is a block diagram of a parallel analog-to-digital converter architecture with an adaptive mismatch estimator and a mismatch equalizer in accordance with another embodiment of the present invention.

FIG. 10 is a block diagram of a parallel analog-to-digital converter architecture including an adaptive mismatch estimator unit 200 and a mismatch equalizer unit 100 in accordance with another embodiment of the present invention. In one example, the architecture is of the type disclosed in U.S. Pat. No. 6,177,893, incorporated herein by reference. The analog-to-digital converter architecture can include a signal splitter 52 and a parallel array of analog-to-digital converters 55F, each having associated mismatches. The signal splitter 52 can be implemented with a standard radio frequency (RF) analog signal splitter/combiner. In one embodiment, the sample clocks for each of the converters 55F can use appropriately phase-shifted clocks for time-interleaved conversion. In one embodiment, each of the converters 55F can be matched in gain, phase, and DC-offset by the adaptive mismatch compensator systems and methods disclosed herein to provide high-resolution performance. Mismatched converters 55F can introduce undesired copies or images of the signals, which are distributed across the frequency band, and can significantly degrade the resolution. Images appear similar to harmonic or intermodulation distortion and can severely limit the dynamic range of the system. To compensate for mismatches in the converted digital signals 20A, an adaptive mismatch estimator unit 200 analyzes the mismatches in the converted digital signals 20A to determine the amount of mismatches and outputs matching parameters 40. The matching parameters 40 are representative of the amount of gain mismatch, phase shift, and DC-offset between each of the converted digital signals 20A. A mismatch equalizer unit 100 compensates the mismatches in the signals 20A based on the matching parameters 40 and outputs matched signals 30A. The analog-to-digital converter system uses a plurality of analog-to-digital converters 55F in parallel to multiply the effective bandwidth while providing high-resolution conversion.

Note that, in one embodiment, rather than simply attenuating distortion products (e.g., with a notch filter), the mismatch equalizer unit 100 can introduce a correction signal that cancels the mismatches and thereby minimizes the image distortion products. Therefore, these image distortion products can be accurately eliminated even in a case where a desired signal overlaps the distortion in the frequency domain.

Figure 11:
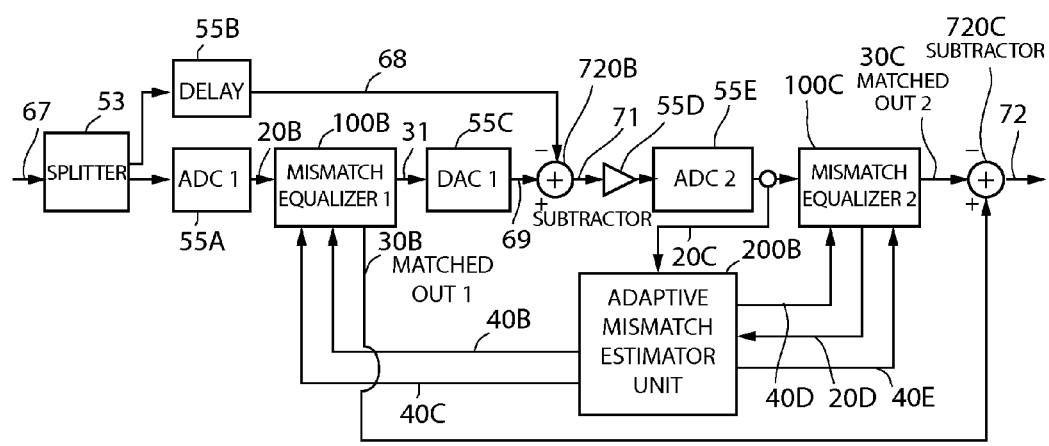
FIG. 11 is a block diagram of a multi-stage analog-to-digital converter architecture with an adaptive mismatch estimator and a plurality of mismatch equalizers in accordance with another embodiment of the present invention.

FIG. 11 is a block diagram of a multi-stage analog-to-digital converter architecture with an adaptive mismatch estimator unit 200B and multiple mismatch equalizers 100B, 100C in accordance with another embodiment of the present invention. The system for analog-to-digital conversion depicted in FIG. 11 uses two or more high-speed, high-resolution analog-to-digital converters 55A, 55E along with the background adaptive mismatch estimation and compensation techniques and methods of the present invention to successively cancel signals from the analog input 67 with each stage of conversion and thereby allow extremely wide dynamic range, high-resolution digitization. This approach to conversion can provide, for example, 36 dB or greater improvement in spurious free dynamic range (SFDR), as compared to current state-of-the-art ADCs, over an extremely wide bandwidth. Conventional multi-stage converter architectures without adaptive mismatch compensation often suffer from transfer function discontinuities due to gain mismatch, phase shift, and DC-offset mismatches between the multiple ADC stages. These discontinuities introduce nonlinear distortion that can severely limit the usable spurious free dynamic range.

To enable high-resolution performance, the ADCs should be matched, which can oftentimes be challenging in conventional systems, because the mismatches are a function of input frequency, amplitude, sample rate, and temperature changes. Embodiments of the present invention accurately track and compensate for frequency-dependent gain, phase, and DC-offset mismatches caused, for example, by ripple in the analog delay line, frequency response of the buffer amplifier, and gain/phase shift in the individual ADCs, the digital-to-analog converter (DAC), line length mismatches, and mismatches caused by analog front end components. A significant feature of the configuration of the type shown in FIG. 11 is the ability for the ADC system to adaptively compensate itself in the background to insure optimal dynamic range by successively cancelling signals; this does not require any prior knowledge of the signal waveforms, frequency content, or amplitude, nor does it require the interruption of the normal operation of the system or the injection of analog calibration signals. Rather than using digital post-processing to simply filter out large signals with a notch filter, this ADC architecture itself can inherently cancel the signals successively with each stage of conversion by using the adaptive mismatch compensation systems and methods disclosed herein to insure stable and accurate interstage matching. This ADC architecture provides true dynamic range to a high level of accuracy because it allows the recovery of a very low level signal, even in the presence of a simultaneous high-power interfering signal, for example, 100 dB, or more, higher in amplitude.

The analog-to-digital converter architecture depicted in FIG. 11 includes a plurality of analog-to-digital converters 55A, 55E with associated mismatches, wherein input signals are successively cancelled at each stage of conversion, allowing a more accurate conversion than a single converter provides. The analog input signal 67 is split with a signal splitter 53. The outputs of a signal splitter 53 can be applied to both a delay element 55B and a first stage analog-to-digital converter 55A. The signal splitter 53 can be implemented with a standard RF analog signal splitter/combiner. A first stage mismatch equalizer 100B compensates for mismatches in the first stage digital signal 20B of first stage analog-to-digital converter 55A to provide a first stage matched output 30B and a first stage matched digital signal 31. The first stage matched digital signal 31 is applied to a first stage digital-to-analog converter 55C. The digital-to-analog converter 55C produces a first stage analog signal 69 that is subtracted from the delayed analog input signal 68 by the subtractor 720B. The delayed analog input signal 68 is the output of the delay element 55B. The output of the subtractor 720B represents a residual signal 71 where signals from the system input to the splitter 53 have been cancelled. Accurate cancellation occurs when the mismatches between the delayed analog input signal 68 and the first stage analog signal 69 are matched. A first stage mismatch equalizer 100B can be used to match the delayed analog input signal 68 and the first stage analog signal 69 in gain, phase, and DC-offset. The output of the subtractor 720B represents a residual signal 71 and is applied to a signal level amplifier 55D. The output of the signal level amplifier 55D is applied to a second stage analog-to-digital converter 55E to produce a second stage digital signal 20C with additional mismatches. A second stage mismatch equalizer 100C compensates for mismatches between the second stage digital signal 20C and the first stage digital signal 20B. Accurate compensation of these mismatches aligns the signal paths through the first stage analog-to-digital converter 55A and a second stage analog-to-digital converter 55E. Without matched signals, the quantization noise and distortion introduced by a first stage analog-to-digital converter 55A may not be accurately canceled when the first stage matched output 30B is combined with the second stage matched output 30C, thereby significantly limiting the effective resolution of the analog-to-digital conversion system.

As described in more detail below, an adaptive mismatch estimator 200B can be used to calculate the amount of mismatch between the delayed analog input signal 68 and the first stage analog signal 69 by monitoring second stage digital signal 20C, and generate the corresponding matching parameters 40B and 40C. Also as described in more detail below, the adaptive mismatch estimator 200B can be used to calculate the amount of mismatch between the first stage digital signal 20B and the second stage digital signal 20C by monitoring the magnitude of a background calibration sequence in the second stage digital signal 20C. The first stage mismatch equalizer 100B can add the background calibration sequence signal 161 to signal 31 such that the adaptive mismatch estimator unit 200B can measure the mismatches between the first stage digital signal 20B and the second stage digital signal 20C and generate the corresponding matching parameters 40D, 40E.

In one example embodiment, a two-stage analog-to-digital converter architecture in accordance with embodiments disclosed herein can use two 8-bit, 1.2 GSPS ADCs to realize an ADC system with the equivalent of 14-bit, 1.2 GSPS performance. A first stage ADC 55A provides a coarse 8-bit estimate of the incoming signal 67, and a second stage ADC 55E provides a fine estimate of the incoming signal 67, such that the combination of the coarse and fine estimates represents 14-bit resolution analog-to-digital conversion. The coarse 8-bit estimate is processed with the first stage mismatch equalizer 100B, converted to a first stage analog signal 69 via a 14-bit, 1.2 GSPS digital-to-analog converter 55C, and subtracted from the delayed analog input signal 68 with the subtractor 720B to provide a residual signal 71. The first stage mismatch equalizer 100B insures that the delayed analog input signal 68 is matched with the first stage analog signal 69 such that the subtractor 720B effectively cancels large amplitude signals from the input delayed analog input signal 68. This residual signal 71 represents the quantization noise and nonlinear distortion in the first stage digital signal 20B, which represents the coarse estimate from the first stage ADC 55A. This residual signal 71 is then amplified with a buffer amplifier 55D and digitized by the second stage 8-bit ADC 55E. The second stage digital signal 20C represents the digitized residual signal from the second stage ADC 55E and processed with the second stage mismatch equalizer 100C to insure that the first stage digital signal 20B is matched with the second stage digital signal 20C. The first stage matched output 30B represents a coarse signal estimate of the input signal 67, and the second stage matched output 30C represents an estimate of the quantization noise and distortion generated by the first stage ADC 55A. In one embodiment, the first stage matched output 30B and the second stage matched output 30C can be combined by a subtractor 720C. The subtractor 720C subtracts signal 30C from 30B to effectively cancel the quantization noise and distortion and provide a single output 72 representing a high-resolution converted digital version of the input 67. This cancellation of quantization noise and distortion by combining the first and second stage ADCs provides 14-bit, 1.2 GSPS system performance.

Figure 12:
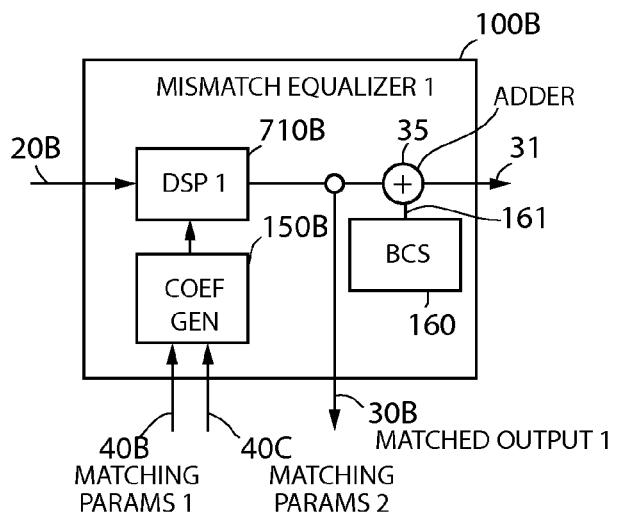
FIG. 12 is a detailed block diagram of the first stage mismatch equalizer illustrated in FIG. 11 in accordance with an embodiment of the present invention.

FIG. 12 is a detailed block diagram of an embodiment of the first stage mismatch equalizer 100B illustrated in FIG. 11 in accordance with an embodiment of the present invention. A first stage mismatch equalizer 100B can include a digital signal processor 710B to compensate for gain and phase mismatches in the first stage digital signal 20B and to provide a first stage matched output signal 30B. The digital signal processor 710B can be implemented, in one embodiment, with a finite impulse response digital filter. A coefficient generator 150B calculates appropriate filter coefficients based on matching parameters 40B provided by the adaptive mismatch estimator unit 200B, as shown in FIG. 11. As described in more detail below, matching parameters 40B are iteratively changed by the adaptive mismatch estimator unit 200B to calculate the optimal matching parameters 40B that insure that the delayed analog input signal 68 and the first stage analog signal 69 are well matched. Referring back to FIG. 12, a background calibration sequence 160 provides a background calibration sequence signal 161 that can be added to the output of the first stage digital signal processor 710B with adder 35 to produce a composite digital signal 31. The composite digital signal 31 includes both the first stage matched output 30B and the background calibration sequence signal 161. This background calibration sequence signal 161 is added to the first stage matched output 30B to characterize the mismatches between first stage digital signal 20B and second stage digital signal 20C, as shown in FIG. 11 and described in more detail below.

Figure 13:
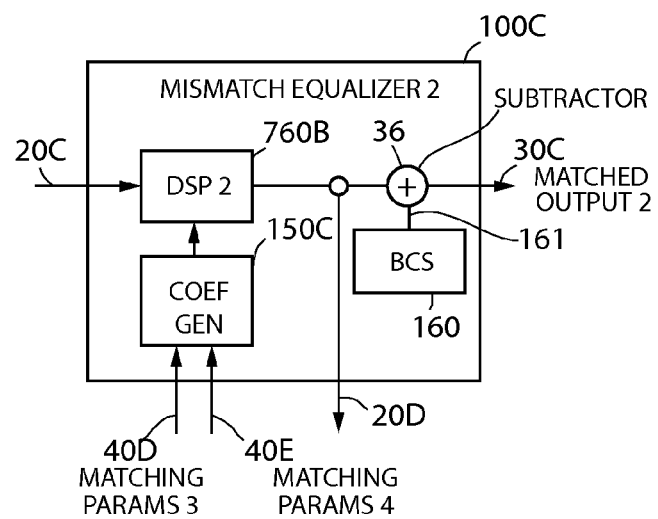
FIG. 13 is a detailed block diagram of the second stage mismatch equalizer illustrated in FIG. 11 in accordance with an embodiment of the present invention.

FIG. 13 is a detailed block diagram of an embodiment of the second stage mismatch equalizer 100C illustrated in FIG. 11 in accordance with an embodiment of the present invention. A second stage mismatch equalizer 100C can include a digital signal processor 760B to compensate for mismatches between first stage digital signal 20B and second stage digital signal 20C. A digital signal processor 760B can be implemented, in one embodiment, with a finite impulse response digital filter. A coefficient generator 150C calculates appropriate filter coefficients based on matching parameters 40D provided by the adaptive mismatch estimator unit 200B, as shown in FIG. 11. As described in more detail below, matching parameters 40D are iteratively changed by the adaptive mismatch estimator unit 200B to calculate the optimal matching parameters 40D that insure that the first stage digital signal 20B and the second stage digital signal 20C are well matched. The background calibration sequence 160 provides a background calibration sequence signal 161 that can be subtracted from signal 20D to produce a second stage matched output 30C that does not contain the background calibration sequence signal 161.

FIG. 14 is a detailed block diagram of an embodiment of the adaptive mismatch estimator illustrated in FIG. 11 in accordance with an embodiment of the present invention. The adaptive mismatch estimator unit 200B includes, in this embodiment, first and second gain and phase estimators 700A, 750A. The first gain and phase estimator 700A analyzes second stage digital signal 20C and generates estimates of the gain 390A, estimates of the phase 490A, and corresponding matching parameters 40B which are used to optimize the estimation accuracy. The matching parameters 40B are iteratively changed by the first gain and phase estimator 700A to calculate the optimal matching parameters 40B that insure that the delayed analog input signal 68 and the first stage analog signal 69 are well matched. Similarly, the second gain and phase estimator 750A analyzes signal 20D and generates estimates of the gain 390B, estimates of the phase shift 490B, and corresponding matching parameters 40D which are also used to optimize the estimation accuracy. Matching parameters 40D are iteratively changed by the first gain and phase estimator 750A to calculate the optimal matching parameters 40D that insure that the first stage digital signal 20B and the second stage digital signal 20C are well matched.

Also, an adaptive mismatch estimator 200B can optionally include a mismatch cataloger 600B, which stores a history of various measurements, including, but not limited to, gain estimates 390A, 390B, phase estimates 490A, 490B, and other relevant parameters such as mode of operation 670, temperature 680, and time 690. The mismatch cataloger 600B outputs matching parameters 40C and 40E that are calculated heuristically based on the current operating conditions, such as time, temperature, and mode of operation. When the adaptive mismatch estimator 200B includes the mismatch cataloger 600B, the first and second mismatch equalizers 100B and 100C operate on matching parameters 40C and 40E respectively instead of mismatch parameters 40B and 40D. The mismatch cataloger 600B can record a number of different measurements to allow for accurate interpolation or extrapolation of the matching parameters 40C and 40E, given the system's current operating mode, current temperature, other current conditions, and over a range of frequencies. This record of different measurements can be stored in a mismatch catalog, as shown in FIG. 17. Referring back to FIG. 14, the mismatch cataloger 600B can extract the most relevant mismatch measurements from the mismatch catalog in response to the current operating conditions of the system, such as mode of operation 670, temperature 680, time 690, and frequency. In one example embodiment, the mismatch cataloger 600B can extract all of the gain, phase-shift, and DC-offset measurements that have been stored in the mismatch catalog that are for the current operating mode 670, within 5 degrees Celsius of the current temperature 680, within the last 30 seconds of the current time 690, and over all the frequencies at which measurements have been stored in the mismatch catalog. Repeated mismatch measurements at the same frequency can be averaged for a more accurate estimation. Missing mismatch measurements for particular frequencies can be interpolated or extrapolated from the extracted mismatch measurements. Mismatch measurements that vary significantly from previously stored measurements can be discarded since they may indicate a measurement glitch. This process performed by the mismatch cataloger 600B of extracting the relevant data from the mismatch catalog, combining repeated measurements, interpolating or extrapolating missing measurements, and discarding inaccurate measurements is a heuristic process that generates matching parameters 40C and 40E. Matching parameters 40C and 40E operate on the first mismatch equalizer 100B and the second mismatch equalizer 100C, respectively, to provide accurate, stable compensation of mismatches since the matching parameters 40C and 40E use a heuristically combined history of measurements.

In contrast, without the mismatch cataloger 600B, matching parameters 40B and 40D operate on the first and second mismatch equalizers 100B and 100C, respectively, to iteratively optimize the gain estimates 390A and 390B and phase-shift estimates 490A and 490B, in one embodiment, with a Newton's Method optimization.

FIG. 15 is a detailed block diagram of a first gain and phase estimator illustrated in FIG. 14 in accordance with an embodiment of the present invention. A cancellation estimator 730A can be used to calculate the vector cancellation levels 735A of the second stage digital signal 20C. The cancellation estimator 730A can be implemented, in one embodiment, as a running average of the squared amplitude of the second stage digital signal 20C. Alternatively, the cancellation estimator 730A can include frequency selective filtering to estimate the level of cancellation of the signal over a particular frequency band. A gain and phase processor 740A analyzes the vector cancellation level 735A and successively adjusts the gain and phase shift, represented in the matching parameters 40B, using, in one embodiment, an iterative optimization, such as Newton's Method until the vector cancellation level 735A is minimized. The cancellation level 735A is representative of the magnitude of the difference between the delayed analog input signal 68 and the first stage analog signal 69 shown in FIG. 11. Signals 68 and 69 can be considered to be matched in gain and phase shift if, when one signal is subtracted 720B from the other, the magnitude of the difference signal, represented as second stage digital signal 20C, is at a minimum. Referring back to FIG. 15, the final gain estimate 390A and phase estimate 490A is representative of the value of a variable gain and phase shift, represented in the matching parameters 40B that minimize the cancellation level 735A.

FIG. 16 is a detailed block diagram of a second gain and phase estimator illustrated in FIG. 14 in accordance with an embodiment of the present invention. As described above in reference to FIG. 12, a background calibration sequence signal 161 can be added to the output of the first stage digital signal processor 710B to produce a composite digital signal 31. The composite digital signal 31 includes both the first stage matched output 30B and the background calibration sequence signal 161. The background calibration sequence signal 161, in one embodiment, can be generated with a random number generator and stored in a memory device, such as a read only memory (ROM). Referring back to FIG. 16, the magnitude of the background calibration sequence signal 161 can then be evaluated with the level estimator 770A. Since the background calibration sequence signal 161 is statistically unrelated to signal 30B, its detected level is largely unaffected by the current signals 30B.

As described above in reference to FIG. 13, the background calibration sequence signal 161 can be subtracted from signal 20D to generate a second stage matched output 30C that does not contain the background calibration sequence 160 so that it does not adversely affect the output 30C. Referring back to FIG. 16, the level estimator 770A can be implemented, in one embodiment, via a running average of the multiplicative product of the background calibration sequence signal 161 and the signal 20D. The running average can be implemented, in one embodiment, in a digital signal processor, a field programmable gate array, or an integrated circuit with dedicated logic. A background calibration sequence processor 780A analyzes the background calibration sequence levels 775A and successively adjusts the phase shift, represented in matching parameters 40D, using, in one embodiment, an iterative optimization, such as Newton's Method, until the background calibration sequence levels 775A are maximized. The background calibration sequence levels 775A are representative of the relative gain between the background calibration sequence signal 161 and the signals 20D. The signal 20D can be considered to be phase matched with the background calibration sequence signal 161 when the background calibration sequence level 775A is maximized. The phase estimate 490B is equal to the value of the variable phase shift, represented in matching parameters 40D, that maximizes the background calibration sequence levels 775A. The gain estimate 390B is equal to the maximized value of the background calibration sequence levels 775A. The gain estimates 390B and phase estimates 490B are representative of the mismatch between first stage digital signal 20B and second stage digital signal 20C, as shown in FIG. 11, because the background calibration sequence signal 161 was added to signal 20B, and the background calibration sequence levels 775A are measured using signal 20D. Referring back to FIG. 16, a benefit of this embodiment of a gain and phase estimator 750A is that it uses a background calibration sequence level estimator 770A to continually monitor changes in the gain and phase mismatches without necessitating taking the system offline. The background calibration sequence signal 161 does not interfere with the normal operation of the system because it can be subtracted from the signal path as described above.

FIG. 18 is a flow chart showing a process for heuristically compensating mismatches in accordance with embodiments of the present invention. In one embodiment, this process can be controlled by a mismatch cataloger 600, as shown in FIG. 4. The mismatch cataloger can be implemented as a microprocessor, an embedded processor within a field programmable gate array. The mismatch cataloger receives as input various mismatches, such as gain estimates 390, phase estimates 490, and DC-offset estimates 590. The mismatch cataloger 600 also receives as input, the current operating mode 670, temperature 680, and time 690.

Referring back to FIG. 18, the process for heuristically compensating mismatches includes a step 805 of evaluating the amplitudes of the mismatched signals 20 and frequency content and a step 810 of determining if the mismatched signals 20 are suitable for an accurate estimation of mismatches. The accuracy of the estimation can be degraded, for example, if the mismatched signal levels are very low (for example, less than −20 dBFS); therefore, for the most accurate estimation, the process can continually monitor the incoming signal until its amplitude is above a predetermined threshold. The signal amplitude and frequency content can be measured, in one embodiment, with a FFT analysis of the input signals. A 512 point FFT can be performed with a microprocessor or embedded processor, and the magnitude of each FFT bin can be measured to determine the signal amplitude at various frequencies.

If the signal amplitude and frequency content is suitable, then the gain, phase, and DC-offset mismatches can be estimated in step 815 in accordance with the various mismatch estimator unit 200 and methods described herein. An optional step 820 can be performed to compare the current estimations with factory calibration values stored in a mismatch catalog to insure that the current estimations are not significantly different. A significant difference can indicate a component failure, a signal glitch, or other anomaly, whereby a determination can be made that the current estimation is not valid. If the current estimation is determined to be valid in step 820, then the new estimates are stored 825 in the mismatch catalog.

Based on the current operating conditions, such as current operating mode 670, temperature, 680, and time 690, the mismatch catalog is searched and any relevant measurements are extracted 830, such as measurements near the current system temperature or having the same operating mode. If any pertinent measurements are missing from the catalog, they can be interpolated or extrapolated 835. For example, the catalog may contain estimates at a few different frequencies, but the values at the remaining frequencies can be interpolated or extrapolated using, in one embodiment, spline data fitting algorithms. Based on the interpolated/extrapolated data, the optimal matching parameters 40 can be calculated 840. The matching parameters 40 can include, in one embodiment, a plurality of amplitude and phase levels at various different frequencies, such that a digital filter design algorithm, such as a least-squares optimization, can calculate a finite impulse response digital filter closely approximating the desired response. These matching parameters 40 are used to update 845 a mismatch equalizer 100 with the newly calculated parameters. This procedure continually monitors the performance of a system with mismatches 50, estimates those mismatches, and equalizes those mismatches with a mismatch equalizer unit 100, without necessitating the interruption of the normal operation of the system.

For improved performance, the step 835 of interpolating or extrapolating missing data can optionally include steps of averaging repeated measurements at the same frequency, favoring measurements with higher input signal level, or favoring measurements that were taken more recently. In addition, step 805 of evaluating signal levels and frequency content can include a step of triggering data collection on high input signal levels to calibrate using burst signals for particular applications, such as radar or certain communications systems.

Embodiments of the present invention overcome drawbacks of conventional approaches to correction of signal mismatches by adaptively compensating for mismatches in the background without interrupting the normal operation of the system. Furthermore, unlike conventional approaches, embodiments of the present invention are capable of compensating mismatches as a function of input frequency. Embodiments of the present invention can also compensate for mismatches that change with time, temperature, mode of operation, air flow, signal amplitude, waveform type, and other dynamic parameters. Embodiments of the present invention can catalog a history of mismatch estimates and heuristically combine relevant measurements for accurate mismatch equalization. Embodiments of the present invention can also be directed to methods and apparatuses for analog-to-digital conversion using a plurality of analog-to-digital converters for high-speed, high-resolution performance. Embodiments of the present invention are also directed towards techniques for estimating mismatches using cancellation approaches, background calibration sequence approaches, and phase difference monitoring approaches.

While embodiments of the invention have been particularly shown and described with references to preferred embodiments thereof, it will be understood by those skilled in the art that various changes in form and details may be made herein without departing from the spirit and scope of the invention as defined by the appended claims.

What is claimed is:

1. A multi-stage analog-to-digital converter that compensates for mismatches in signals during normal operation, comprising:
    a first analog-to-digital converter that converts an analog input signal into a corresponding first stage digital signal;
    an analog delay unit that delays the analog input signal to generate a delayed analog input signal;
    a first mismatch equalizer that compensates mismatches between the delayed analog input signal and a first stage analog signal during normal operation of the multi-stage analog-to-digital converter in response to first matching parameters and that outputs a first stage matched digital signal;
    a first digital-to-analog converter that converts the first stage matched digital signal to the first stage analog signal;
    a subtractor that subtracts the delayed analog input signal from the first stage analog signal to generate a residual analog signal;
    a second analog-to-digital converter that converts the residual analog signal into a corresponding second stage digital signal;
    a second mismatch equalizer that compensates mismatches between the first stage digital signal and the second stage digital signal output by the second analog-to-digital converter during normal operation of the multi-stage analog-to-digital converter in response to second matching parameters and that outputs a second stage matched digital signal; and
    a mismatch estimator that monitors the second stage digital signal during normal operation of the multi-stage analog-to-digital converter and that generates the first matching parameters indicating an amount of mismatch between the delayed analog input signal and the first stage analog signal and that generates the second matching parameters indicating an amount of mismatch between the first stage digital signal and the second stage digital signal, the mismatch estimator updating the first and second matching parameters during normal operation of the multi-stage analog-to-digital converter,
    wherein the mismatch estimator continually monitors the second stage digital signal and continually updates the first matching parameters and the second matching parameters during normal operation of the multi-stage analog-to-digital converter, and wherein the first and second mismatch equalizers adaptively compensate mismatches between the analog input signal and the first stage analog signal, and between the first stage digital signal and the second stage digital signal, respectively, during normal operation of the multi-stage analog-to-digital converter.

2. The multi-stage analog-to-digital converter of claim 1 further comprises a signal level amplifier that amplifies the residual analog signal to generate an amplified residual analog signal and wherein the second analog-to-digital converter converts the amplified residual analog signal into the corresponding second stage digital signal.

3. The multi-stage analog-to-digital converter of claim 1 wherein the first matching parameters and second matching parameters comprise at least one of: a DC-offset parameter, a gain parameter, and a phase parameter.

4. The multi-stage analog-to-digital converter of claim 1 wherein the first mismatch equalizer comprises:
    a first coefficient generator that receives the first matching parameters and generates filter coefficients;
    a first digital signal processor that generates a first stage matched output signal in response to the filter coefficients; and
    an adder for adding a background calibration sequence signal to the first stage matched output to generate the first stage matched digital signal.

5. The multi-stage analog-to-digital converter of claim 1 wherein the second mismatch equalizer comprises:
    a second coefficient generator that receives the second matching parameters and generates filter coefficients;
    a second digital signal processor that generates a second stage matched output signal in response to the filter coefficients; and
    a subtractor for subtracting the background calibration sequence signal from the second stage matched output signal to generate the second stage matched digital signal.

6. The multi-stage analog-to-digital converter of claim 1 wherein the mismatch estimator comprises:
    a first gain and phase estimator that calculates gain estimates and phase estimates between the delayed analog input signal and the first stage analog signal;
    a second gain and phase estimator that calculates gain estimates and phase estimates between the first stage digital signal and the second stage digital signal; and
    wherein the mismatch estimator generates the first and second matching parameters in response to at least one of the gain estimates and the phase estimates of the first and second gain and phase estimators, respectively.

7. The multi-stage analog-to-digital converter of claim 1 wherein the mismatch estimator further comprises:
    a cataloger that stores histories of at least one of the gain estimates and the phase estimates of the first and second gain and phase estimators, and heuristically processes the stored estimates to generate third matching parameters indicating an amount of mismatch between the delayed analog input signal and the first stage analog signal, and fourth matching parameters indicating an amount of mismatch between the first stage digital signal and the second stage digital signal.

8. The multi-stage analog-to-digital converter of claim 7 wherein the cataloger further stores histories of at least one of time, temperature and mode of operation information of the multi-stage analog-to-digital converter and heuristically processes the stored estimates and information to generate the third and the forth matching parameters.

9. The multi-stage analog-to-digital converter of claim 6 wherein the first gain and phase estimator comprises:
    a cancellation estimator that calculates the magnitude of the vector cancellation between the delayed analog input signal and the first stage analog signal, and that generates a vector cancellation level signal;

a gain and phase processor that processes the vector cancellation level signal and generates gain and phase estimate signals; and wherein the first gain and phase processor processes the vector cancellation level signal and generates the first matching parameters using an iterative optimization.

10. The multi-stage analog-to-digital converter of claim 6 wherein the second gain and phase estimator comprises:

a background calibration sequence level estimator that calculates the magnitude of a background calibration level sequence and generates a calibration sequence level signal;

a background calibration sequence processor that processes the background calibration level sequence signal and generates gain and phase estimate signals; and wherein the background calibration sequence processor processes the background calibration level sequence signal and generates the second matching parameters using an iterative optimization.

11. A method of compensating for mismatches in output signals of a system with mismatches during normal operation of the system with mismatches, comprising:

monitoring at least two mismatched signals output by the system with mismatches during normal operation and generating matching parameters indicating an amount of mismatch between the at least two mismatched signals, the mismatch estimator updating the matching parameters during normal operation of the system with mismatches; and compensating mismatches in the mismatched signals output by the system with mismatches during normal operation of the system with mismatches in response to the matching parameters, wherein monitoring comprises continually monitoring the at least two mismatched signals output by the system with mismatches and wherein updating comprises continually updating the matching parameters during normal operation of the system with mismatches, and wherein compensating comprises adaptively compensating mismatches in the mismatched signals output by the system with mismatches during normal operation of the system with mismatches.

12. The method of claim 11 wherein the matching parameters comprise at least one of: a DC-offset parameter, a gain parameter, and a phase shift parameter.

13. The method of claim 11 wherein compensating mismatches in the mismatched signals comprises compensating mismatches in at least two mismatched signals as a function of frequency.

14. The method of claim 11 wherein compensating mismatches further comprises:

receiving matching parameters and generating filter coefficients; and compensating for gain and phase mismatches in response to the filter coefficients.

15. The method of claim 11 wherein compensating mismatches further comprises at least one of:

calculating gain estimates of the at least two mismatched signals output by the system with mismatches;

calculating phase estimates of the at least two mismatched signals output by the system with mismatches; and calculating DC-offset estimates of the at least two mismatched signals output by the system with mismatches; and wherein generating the matching parameters is in response to at least one of the gain estimates, the phase estimates and the DC-offset estimates.

16. The method of claim 15 wherein monitoring further comprises storing histories of at least one of the gain estimates, the phase estimates and the DC-offset estimates, and heuristically processing the stored estimates to generate the matching parameters.

17. The method of claim 16 wherein monitoring further comprises storing histories of at least one of time, temperature and mode of operation information of the system with mismatches and heuristically processing the stored estimates and information to generate the matching parameters.

18. The method of claim 15 wherein monitoring further comprises:

selecting a frequency band of the at least two mismatched signals to be partitioned of the system with mismatches;

partitioning each of the at least two mismatched signals output by the system with mismatches into channelized signals wherein the channelized signals represent frequency bands of the unmatched output signals of the system with mismatches;

wherein calculating gain estimates comprises calculating gain estimates of the channelized signals, wherein calculating phase estimates comprises calculating phase estimates of the channelized signals, and wherein calculating DC-offset estimates comprises calculating DC-offset estimates of the channelized signals.

19. The method of claim 18 wherein calculating phase estimates further comprises:

adjusting phases of the channelized signals in response to variable phase shift signals and generating difference signals;

subtracting the phase shifted signals of respective variable phase shifters and generating phase difference signals;

calculating the magnitudes of the difference signals and generating phase difference signals; and processing the phase difference signals and generating phase estimates.

20. The method of claim 19 wherein processing the phase difference signals further comprises processing the phase difference signals comprises generating the variable phase shift signals using an iterative optimization and generating phase estimate signals.

21. The method of claim 19 wherein calculating the magnitudes of the difference signals further comprises generating the phase difference signals by a running average of the squared amplitude of each of the difference signals.

22. The method of claim 18 wherein monitoring further comprises calculating gain estimates and phase estimates of the channelized signals.

23. The method of claim 22 wherein calculating gain estimates and phase estimates of the channelized signals further comprises:

adjusting gains and phases of the channelized signals in response to variable gain and phase shift signals and generating gain and phase shifted signals;

subtracting the gain and phase shifted signals of respective variable gain and phase shifters and generating difference signals;

calculating the magnitude of the vector cancelation of the difference signals and generating vector cancellation level signal; and processing the vector cancellation level signals and generating gain and phase estimate signals.

24. The method of claim 23 wherein processing the vector cancellation level signals and generating gain and phase estimate signals further comprises processing the vector cancellation level signals and generating variable gain and phase shift signals using an iterative optimization and generating gain and phase estimate signals.

25. The method of claim 22 wherein calculating gain estimates and phase estimates of the channelized signals further comprises:
adjusting a phase of the channelized signals in response to variable phase shift signals and generating phase shifted signals;
calculating the magnitude of the background calibration sequence signal and generating calibration sequence level signals; and
processing the calibration level sequence signals and generating gain and phase estimate signals.

26. The method of claim 25 wherein processing the calibration level sequence signals and generating gain and phase estimate signals further comprises processing the calibration level sequence signals and generating variable phase shift signals using an iterative optimization and generating gain and phase estimate signals.

27. A method for compensating mismatches in a system with mismatches, the method comprising:
monitoring at least two mismatched signals output by the system with mismatches;
determining amplitudes of the at least two mismatched signals;
determining frequency content of the at least two mismatched signals; and
during normal operation of the system with mismatches, determining whether the at least two mismatched signals are suitable for an accurate estimation of at least one of: gain mismatch, phase mismatch, and DC-offset based on the determined amplitudes and frequency content of the at least two mismatched signals,
determining whether the estimated at least one of the gain mismatch, the phase mismatch, and the DC-offset are within factory calibration values prior to compensating; and
during normal operation of the system with mismatches, estimating at least one of the gain mismatch, the phase mismatch, and the DC-offset between the at least two mismatched signals;
compensating for mismatches in the at least two mismatched signals based on the estimated at least one of the gain mismatch, the phase mismatch, and the DC-offset between the at least two mismatched signals.

28. The method of claim 27 wherein compensating mismatches in the system with mismatches comprises heuristically compensating, and further comprising:
storing the estimated at least one of the gain mismatch, the phase mismatch, and the DC-offset in a mismatch catalog;
searching the mismatch catalog for relevant estimate measurements;
extracting relevant estimate measurements;
calculating matching parameters based on the extracted measurements; and
compensating for mismatches in the at least two mismatched signals based on the calculated matching parameters.

29. The method of claim 28 wherein compensating mismatches in the system with mismatches further comprises:
interpolating the extracted relevant estimate measurements to generate interpolated measurements, and wherein calculating matching parameters is further based on the interpolated measurements.

30. A multi-stage analog-to-digital converter for converting an analog input signal into a compensated digital output signal comprising:
a splitter, wherein the splitter splits the analog input signal into a first analog output signal and a second analog output signal;
a delay element, wherein the delay elements delays the first analog output signal and outputs a delayed analog input signal;
a first stage analog-to-digital converter, wherein the first stage analog-to-digital converter converts the second analog output signal into a first stage digital signal,
a first stage mismatch equalizer, wherein the first stage mismatch equalizer processes the first stage digital signal into a first stage matched digital signal and outputs a first staged matched output signal,
a digital-to-analog converter, wherein the digital-to-analog converter converts the first stage matched digital signal into a first stage analog signal,
a first subtractor, wherein the first subtractor subtracts the first stage analog signal from the delayed analog input signal to produce a residual analog signal,
a second stage analog-to-digital converter, wherein the second stage analog-to-digital converter converts the residual analog signal into a second stage digital signal,
a second stage mismatch equalizer, wherein the second stage mismatch equalizer processes the second stage digital signal and outputs a second stage matched output signal, and
a second subtractor, wherein the second subtractor subtracts the second stage matched output signal from the first stage matched output signal to produce the compensated digital output signal.

31. The multi-stage analog-to-digital converter of claim 30, wherein the first stage mismatch equalizer and second stage mismatch equalizer are implemented as part of a digital signal processor.

32. The multi-stage analog-to-digital converter of claim 30, further comprising an amplifier for amplifying the residual analog signal prior to its input into the second stage analog-to-digital converter.

33. The multi-stage analog-to-digital converter of claim 30, wherein the first stage matched output signal represents a coarse signal estimate of the input analog signal and the second stage matched output signal represents an estimate of quantization noise and distortion generated by the first stage analog-to-digital converter.

34. The multi-stage analog-to-digital converter of claim 30, further comprising an anti-aliasing filter for filtering the residual analog signal prior to its input into the second stage analog-to-digital converter.

35. The multi-stage analog-to-digital converter of claim 30, further comprising a mismatch estimator wherein the mismatch estimator comprises a first gain and phase estimator that calculates gain estimates and phase estimates between the delayed analog input signal and the first stage analog signal; and wherein the mismatch estimator generates the first matching parameters in response to at least one of the gain estimates and the phase estimates of the first gain and phase estimator.

36. A method for converting an analog input signal into a compensated digital output signal, the method comprising the steps:
splitting the analog input signal into a first analog output signal and a second analog output signal;
delaying the first analog output signal to produce a delayed analog input signal;

converting the second analog output signal into a first stage digital signal, processing the first stage digital signal into a first stage matched digital signal, converting the first stage matched digital signal into a first stage analog signal, subtracting the first stage analog signal from the delayed analog input signal to produce a residual analog signal, converting the residual analog signal into a second stage digital signal, processing the second stage digital signal into a second stage matched output signal, and subtracting the second stage matched output signal from the first stage matched output signal to produce the compensated digital output signal.

37. The method of claim 36, wherein the steps of processing are implemented by a digital signal processor.

38. The method of claim 36, further comprising the step of amplifying the residual analog signal.

39. The method of claim 36, wherein the first stage matched output signal represents a coarse signal estimate of the input analog signal and the second stage matched output signal represents an estimate of quantization noise and distortion generated by the first stage analog-to-digital converter.

40. The method of claim 36, further comprising the step of filtering the residual analog signal.

41. The method of claim 36, further comprising the steps of:

calculating gain estimates and phase estimates between the delayed analog input signal and the first stage analog signal; and generating the first matching parameters in response to at least one of the gain estimates and the phase estimates.

* * * * *